(12) United States Patent
Okada et al.

(10) Patent No.: US 11,205,977 B2
(45) Date of Patent: Dec. 21, 2021

(54) POWER GENERATING ELEMENT

(71) Applicant: TRI-FORCE MANAGEMENT CORPORATION, Saitama-ken (JP)

(72) Inventors: Kazuhiro Okada, Saitama-ken (JP); Miho Okada, Saitama-ken (JP); Satoshi Era, Saitama-ken (JP)

(73) Assignee: TRI-FORCE MANAGEMENT CORPORATION, Saitama-ken (JP)

( * ) Notice: Subject to any disclaimer, the term of this patent is extended or adjusted under 35 U.S.C. 154(b) by 419 days.

(21) Appl. No.: 15/759,482

(22) PCT Filed: Jul. 26, 2017

(86) PCT No.: PCT/JP2017/027093
§ 371 (c)(1),
(2) Date: Mar. 12, 2018

(87) PCT Pub. No.: WO2019/021400
PCT Pub. Date: Jan. 31, 2019

(65) Prior Publication Data
US 2019/0190405 A1    Jun. 20, 2019

(51) Int. Cl.
*H02N 2/18* (2006.01)
(52) U.S. Cl.
CPC ............. *H02N 2/188* (2013.01); *H02N 2/181* (2013.01)
(58) Field of Classification Search
CPC ............................. H02N 2/181; H02N 2/188
USPC ................ 310/328, 329, 339, 348, 349, 351
See application file for complete search history.

(56) References Cited

U.S. PATENT DOCUMENTS

| 6,252,336 B1 | 6/2001 | Hall |
| 6,411,010 B1* | 6/2002 | Suzuki ............... H02N 2/0015 310/323.16 |
| 8,154,174 B2* | 4/2012 | Laermer ............. B60C 23/0411 310/329 |

(Continued)

FOREIGN PATENT DOCUMENTS

| CN | 102859862 A | 1/2013 |
| CN | 105337531   | 2/2016 |

(Continued)

OTHER PUBLICATIONS

Chinese Office Action dated Apr. 17, 2020 for Application No. CN 201780003286.0.

(Continued)

*Primary Examiner* — Bryan P Gordon
(74) *Attorney, Agent, or Firm* — Ladas & Parry LLP

(57) ABSTRACT

A power generating element according to the present invention includes: a support frame formed in a frame shape in plan view; a vibrating body provided inside the support frame; a first bridge portion and a second bridge portion that supports the vibrating body on the support frame; and a charge generating element to generate a charge at the time of displacement of the vibrating body. The support frame includes a first frame portion arranged on a first side with respect to the vibrating body and includes a second frame portion arranged on a second side opposite to the first side with respect to the vibrating body. The first bridge portion couples the vibrating body with the first frame portion. The second bridge portion couples the vibrating body with the second frame portion.

20 Claims, 21 Drawing Sheets

(56) References Cited

U.S. PATENT DOCUMENTS

| | | | |
|---|---|---|---|
| 2013/0038175 A1 | 2/2013 | Ogawa et al. | |
| 2013/0154439 A1 | 6/2013 | Lee et al. | |
| 2013/0207520 A1 | 8/2013 | Near | |
| 2013/0293069 A1* | 11/2013 | Sakaguchi | H01L 41/053 310/348 |
| 2013/0313946 A1 | 11/2013 | Lee et al. | |
| 2013/0328446 A1 | 12/2013 | Horiguchi et al. | |
| 2014/0077662 A1* | 3/2014 | Lueke | H01L 41/22 310/339 |
| 2015/0145376 A1 | 5/2015 | Sun et al. | |
| 2015/0188458 A1 | 7/2015 | Andosca et al. | |
| 2015/0198801 A1* | 7/2015 | Naono | G01L 1/16 359/199.4 |
| 2016/0211778 A1 | 7/2016 | Okada et al. | |
| 2017/0084815 A1* | 3/2017 | Choo | A61N 1/3785 |
| 2017/0110989 A1* | 4/2017 | Okada | H02N 2/181 |
| 2017/0186940 A1* | 6/2017 | Bevilacqua | H01L 41/1138 |
| 2018/0262130 A1* | 9/2018 | Okada | H01L 41/047 |
| 2018/0351481 A1* | 12/2018 | Okada | H01L 41/053 |

FOREIGN PATENT DOCUMENTS

| | | |
|---|---|---|
| EP | 2 566 039 A1 | 3/2013 |
| JP | 10-243667 A | 9/1998 |
| JP | 2010177236 A | 8/2010 |
| JP | 2011-152010 A | 8/2011 |
| JP | 2013-135596 A | 7/2013 |
| JP | 2015050889 A | 3/2015 |
| JP | 2016-517684 A | 6/2016 |
| JP | 2017017939 A | 1/2017 |
| WO | 2010/007735 A1 | 1/2010 |
| WO | 2011/083762 A1 | 7/2011 |
| WO | 2012153593 A1 | 11/2012 |
| WO | 2015/033621 A1 | 3/2015 |

OTHER PUBLICATIONS

Espacenet English abstract of CN 102859862 A.
International Search Report (ISR) dated Nov. 28, 2017 for Application No. PCT/JP2017/027093.
J-PlatPat English translation of JP 2013-135596 A.
Japanese Office Action with an English translation dated Jun. 8, 2021 for corresponding Japanese Patent Application No. JP 2018-150786.
Written Opinion (WO) dated Nov. 28, 2017 for Application No. PCT/JP2017/027093.
Supplementary European Search Report (SESR) dated Dec. 20, 2019 for Application No. EP 17847717.0.
International Preliminary Report on Patentability (IPRP) dated Jan. 28, 2020 for Application No. PCT/JP2017/027093.

* cited by examiner

POWER GENERATING ELEMENT

RELATED APPLICATION

This application is an application under 35 U.S.C. 371 of International Application No. PCT/JP2017/027093 filed on Jul. 26, 2017, the entire contents of which are incorporated herein by reference.

The present invention relates to a power generating element.

BACKGROUND

In order to make effective use of limited resources, there are proposed techniques for converting various forms of energy into electric energy and extracting the converted energy. This includes a technique of converting vibration energy into electric energy and extracting converted energy. For example, JP 10-243667 A discloses a piezoelectric power generating element in which layered piezoelectric elements are laminated to form a power generating piezoelectric element and power generation is performed by causing the power generating piezoelectric element to vibrate by an external force. JP 2011-152010 A discloses a power generating element having a Micro Electro Mechanical System (MEMS) structure using a silicon substrate.

US Patent Publication No. 2013/0154439 discloses a power generating element having a hammer head type structure supporting a weight body. In this power generating element, the weight body constituting a head portion is vibrated and power is generated by a power generating piezoelectric element arranged in a handle portion. WO2015/033621 discloses a piezoelectric element having a structure body that supports a weight body by a plate bridge portion bent in an L shape together with the power generating element having the hammer head type structure.

The basic principle of these power generating elements is to generate periodic deflection in the piezoelectric element by vibrations of the weight body and extract a charge generated on the basis of a stress applied to the piezoelectric element to the outside. By mounting such a power generating element on an automobile, a train, a ship, for example, it is possible to extract vibration energy applied during transportation as electric energy. Moreover, it is also possible to generate power by attaching the power generating element to a vibration source such as a refrigerator and an air conditioner.

SUMMARY

In the power generating elements in the above-described patent documents, a weight body is supported by a bridge portion having a cantilever structure with one end being fixed. In this case, the displacement of the weight body can be increased.

However, excessive displacement of the weight body is regulated in order to prevent plastic deformation and breakage of the bridge portion. In this case, an increase in the displacement of the weight body causes the weight body to abut a member having a function of a stopper, leading to an escape of the force received by the weight body to the member. This leads to a problem of decreasing the stress generated in the bridge portion to decrease the amount of power generated by the piezoelectric element.

The present invention has been made in view of these points, and is intended to provide a power generating element capable of suppressing the displacement of a weight body and increasing the power generation amount.

The present invention provides a power generating element including:
a support frame formed in a frame shape in plan view;
a vibrating body provided inside the support frame;
a first bridge portion and a second bridge portion configured to support the vibrating body on the support frame; and
a charge generating element that generates a charge at the time of displacement of the vibrating body,
in which the support frame includes a first frame portion arranged on a first side with respect to the vibrating body and includes a second frame portion arranged on a second side opposite to the first side with respect to the vibrating body,
the first bridge portion couples the vibrating body with the first frame portion, and
the second bridge portion couples the vibrating body with the second frame portion.

The above-described power generating element may be configured such that the vibrating body includes: a first weight body coupled to the first bridge portion; a second weight body coupled to the second bridge portion; and a third bridge portion coupling the first weight body with the second weight body, and the first weight body and the second weight body are spaced apart from each other.

The above-described power generating element may be configured such that a resonance system defined on the basis of the first weight body and the first bridge portion has a resonance frequency different from a resonance frequency of a resonance system defined on the basis of the second weight body and the second bridge portion.

The above-described power generating element may be configured such that the second weight body and the second bridge portion are individually arranged on both sides of the first bridge portion, the third bridge portion is arranged individually between the first bridge portion and the second bridge portion, the first weight body is coupled to each of the first bridge portion and the third bridge portion, the second weight body is coupled to the corresponding second bridge portion and the corresponding third bridge portion, and one second weight body and the other second weight body are spaced apart from each other.

The above-described power generating element may be configured such that the second bridge portion extends along the first bridge portion, and the third bridge portion extends along the first bridge portion and the second bridge portion.

The above-described power generating element may be configured such that a resonance system defined on the basis of the one second weight body and the corresponding second bridge portion has a resonance frequency same as a resonance frequency of a resonance system defined on the basis of the other second weight body and the corresponding second bridge portion.

The above-described power generating element may be configured such that a first weight body supporting portion that supports the first weight body extends from the first bridge portion, and a first additional weight body is provided on the first weight body, on a side opposite to the first weight body supporting portion side.

The above-described power generating element may be configured such that the first additional weight body includes a first stopper portion provided so as to be able to abut the support frame and to regulate a displacement of the first weight body toward the first weight body supporting portion side, and the first stopper portion is spaced apart from the support frame when the vibrating body is in a neutral position.

The above-described power generating element may be configured such that the first stopper portion is arranged at each of both ends of the first additional weight body in a direction orthogonal to a direction from the first weight body toward the first frame portion.

The above-described power generating element may be configured such that the first stopper portion of the first additional weight body extends to an outer edge of the support frame in plan view.

The above-described power generating element may be configured such that a second weight body supporting portion that supports the second weight body extends from the second bridge portion, and a second additional weight body is provided on the second weight body, on a side opposite to the second weight body supporting portion side.

The above-described power generating element may be configured such that the second additional weight body extends from one second weight body to the other second weight body and is supported by both of the second weight bodies.

The above-described power generating element may be configured such that the second additional weight body includes a second stopper portion provided so as to be able to abut the support frame and to regulate a displacement of the second weight body toward the second weight body supporting portion side, and the second stopper portion is spaced apart from the support frame when the vibrating body is in a neutral position.

The above-described power generating element may be configured such that the support frame includes a protrusion interposed between the first frame portion and the first bridge portion, and the protrusion includes a seat to which the second stopper portion can abut.

The above-described power generating element may be configured such that the second additional weight body further includes a third stopper portion provided so as to be able to abut the support frame and to regulate a displacement of the second weight body toward the second weight body supporting portion side, and the third stopper portion is spaced apart from the support frame when the vibrating body is in the neutral position.

The above-described power generating element may be configured such that the third stopper portion is arranged at each of both ends of the second additional weight body in a direction orthogonal to a direction from the second weight body toward the second frame portion.

The above-described power generating element may be configured such that the third stopper portion of the second additional weight body extends to an outer edge of the support frame in plan view.

The above-described power generating element may be configured such that a second weight body supporting portion that supports the second weight body extends from the second bridge portion, and a second additional weight body is provided on the second weight body, on a side opposite to the second weight body supporting portion side.

The above-described power generating element may be configured such that the charge generating element includes: a lower electrode layer; a piezoelectric material layer provided on the lower electrode layer; and a plurality of upper electrode layers provided on the piezoelectric material layer, each of the upper electrode layers being electrically independent from each other.

The above-described power generating element may be configured to further comprise a power generating circuit that rectifies a current based on a charge generated by the charge generating element and extracts electric power.

According to the present invention, it is possible to suppress the displacement of the weight body and increase the power generation amount.

DETAILED DESCRIPTION

Figure 1:
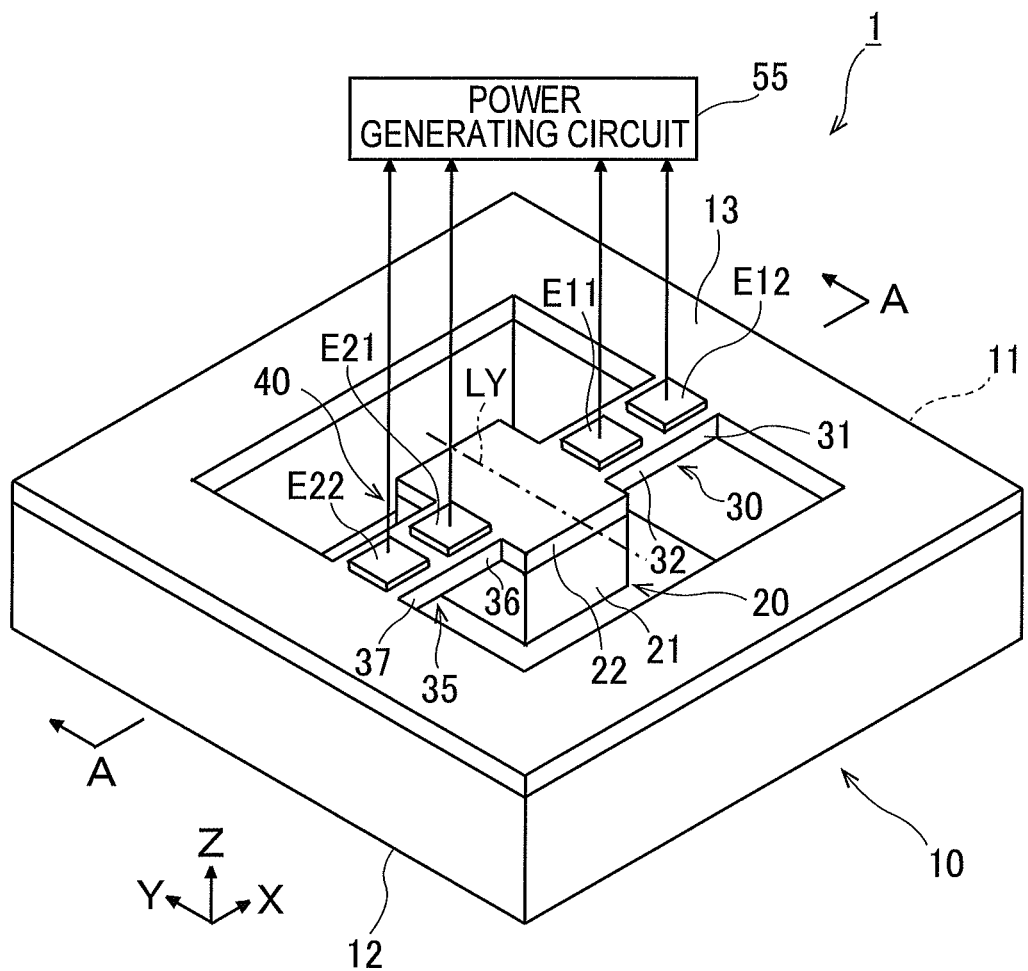
FIG. 1 is a perspective view illustrating an overall configuration of a power generating element according to a first embodiment of the present invention.

Hereinafter, embodiments of the present invention will be described with reference to the drawings. In the drawings attached hereto, for convenience of illustration and ease of understanding, the scales, the aspect ratios in the vertical and horizontal directions or the like have been exaggerated being changed from those of the actual ones.

First Embodiment

A power generating element according to a first embodiment of the present invention will be described with reference to FIGS. 1 to 9. The power generating element according to the present embodiment is an element that converts vibration energy into electric energy thereby generating power.

Figure 2:
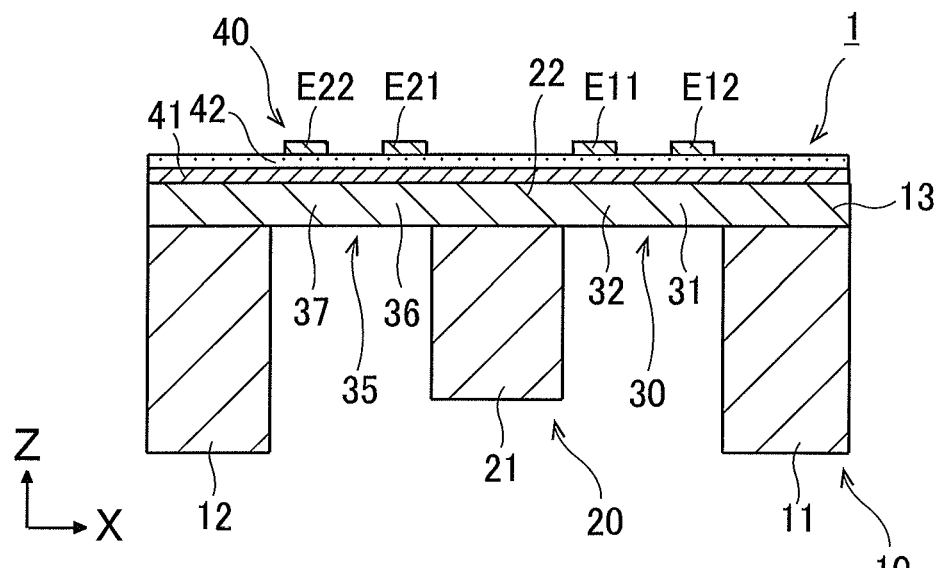
FIG. 2 is a cross-sectional view taken along line A-A in FIG. 1.

FIG. 1 is a perspective view illustrating an overall configuration of the power generating element according to the first embodiment of the present invention. FIG. 2 illustrates a cross-sectional view taken along line A-A in FIG. 1. As illustrated in FIGS. 1 and 2, a power generating element 1 according to the present embodiment includes a support frame 10 formed in a frame shape, a vibrating body 20 provided inside the support frame 10, and a first bridge portion 30 and a second bridge portion 35 to support the vibrating body 20 on the support frame 10. Among these, the support frame 10 is formed in a rectangular frame shape in plan view. The support frame 10 includes a first frame portion 11 arranged on a first side (positive side on the X-axis) with respect to the vibrating body 20 and includes a second frame portion 12 arranged on a second side (negative side on the X-axis) opposite to the first side with respect to the vibrating body 20. Herein, the plan view represents a state as seen in the Z-axis direction illustrated in FIG. 1, that is, a state of the power generating element 1 in a posture illustrated in FIG. 2, viewed from above. For clarity of explanation, an XYZ coordinate system is defined as illustrated in FIG. 1, and the following description will be provided with the power generating element 1 arranged with the Z-axis direction being defined as a vertical direction. Therefore, the power generating element 1 according to the present embodiment is not limited to being used in a posture with the Z-axis direction being defined as the vertical direction.

The first bridge portion 30 is arranged on the first frame portion 11 side of the support frame 10 with respect to a weight body 21 to be described below of the vibrating body 20 and couples the weight body 21 with the first frame portion 11. More specifically, an X-axis positive side end 31 (root end) of the first bridge portion 30 is coupled to the first frame portion 11, while an X-axis negative side end 32 (tip end) of the first bridge portion 30 is coupled to the weight body 21. In this manner, the first bridge portion 30 linearly extends in the X-axis direction between the weight body 21 and the first frame portion 11 to support the weight body 21 on the first frame portion 11. Note that the positive side on the X-axis represents a direction of the arrow indicating the X-axis illustrated in FIG. 1, while the negative side on the X-axis represents a direction opposite to the direction of the positive side on the X-axis. Similar definition will also apply to the positive side on the Y-axis, the negative side on the Y-axis, the positive side on the Z-axis, and the negative side on the Z-axis described below.

The second bridge portion 35 is arranged on the second frame portion 12 side of the support frame 10 with respect to the weight body 21 and couples the weight body 21 with the second frame portion 12. More specifically, an X-axis positive side end 36 (tip end) of the second bridge portion 35 is coupled to the weight body 21, while an X-axis negative side end 37 (root end) of the second bridge portion 35 is coupled to the second frame portion 12. In this manner, the second bridge portion 35 linearly extends in the X-axis direction toward the first bridge portion 30 between the weight body 21 and the second frame portion 12, and the second bridge portion 35 is configured to support the weight body 21 on the second frame portion 12.

The first bridge portion 30 and the second bridge portion 35 are aligned along the X-axis direction to be arranged on a straight line. In other words, the first bridge portion 30 and the second bridge portion 35 are plane-symmetrical with respect to a plane parallel to the Z-axis including a center axis LY extending in the Y-axis direction of the weight body 21. In this manner, the power generating element 1 according to the present embodiment has a double-supported beam structure.

The vibrating body 20 according to the present embodiment includes the weight body 21 formed in a rectangular parallelepiped shape, a weight body supporting portion 22 provided on an upper surface (surface on the positive side on the Z-axis) of the weight body 21. Among them, the weight body supporting portion 22 extends from the first bridge portion 30 to the upper surface of the weight body 21 and is integrally and continuously formed with the first bridge portion 30 and the second bridge portion 35. The weight body supporting portion 22 is formed on the entire upper surface of the weight body 21, and the weight body 21 is joined to the lower surface (surface on the negative side on the Z-axis) of the weight body supporting portion 22 to be supported by the weight body supporting portion 22. With this configuration, the weight body 21 is coupled to the X-axis negative side end 32 of the first bridge portion 30 and to an X-axis positive side end 36 of the second bridge portion 35 via the weight body supporting portion 22 and is supported by the bridge portions 30 and 35 via the weight body supporting portion 22.

As illustrated in FIG. 2, the lower surface of the weight body 21 is positioned above the lower surface of the support frame 10. The weight body 21 can be displaced downward (negative side on the Z-axis) until it abuts a bottom plate 17 of a casing 15 described below.

A bridge supporting portion 13 is provided on the upper surface of the support frame 10. The bridge supporting portion 13 is integrally and continuously formed with the first bridge portion 30 and the second bridge portion 35, and is formed on the entire upper surface of the support frame 10. The bridge supporting portion 13 is joined to the upper surface of the support frame 10, and the bridge portions 30 and 35 are supported on the support frame 10 via the bridge supporting portion 13.

As illustrated in FIG. 1, the power generating element 1 according to the present embodiment further includes a piezoelectric element 40 (charge generating element) to generate a charge at the time of displacement of the vibrating body 20. As illustrated in FIGS. 1 and 2, the piezoelectric element 40 includes a lower electrode layer 41 provided on each of the bridge portions 30 and 35, a piezoelectric material layer 42 provided on the lower electrode layer 41, and a plurality of upper electrode layers E11, E12, E21, and E22 provided on the piezoelectric material layer 42. In other words, the piezoelectric material layer 42 is provided between the lower electrode layer 41 and the upper electrode layers E11, E12, E21, and E22. In the present embodiment, the lower electrode layer 41 is provided over the entire upper surface of the first bridge portion 30, the entire upper surface of the weight body supporting portion 22, the entire upper surface of the second bridge portion 35, and the entire upper surface of the bridge supporting portion 13, being formed integrally. Note that there is no need to provide the lower electrode layer 41 on the upper surface of the bridge supporting portion 13. The piezoelectric material layer 42 is provided on the entire upper surface of the lower electrode layer 41. In FIG. 1, in order to simplify the drawing, the lower electrode layer 41 and the piezoelectric material layer 42 are omitted.

Figure 14:
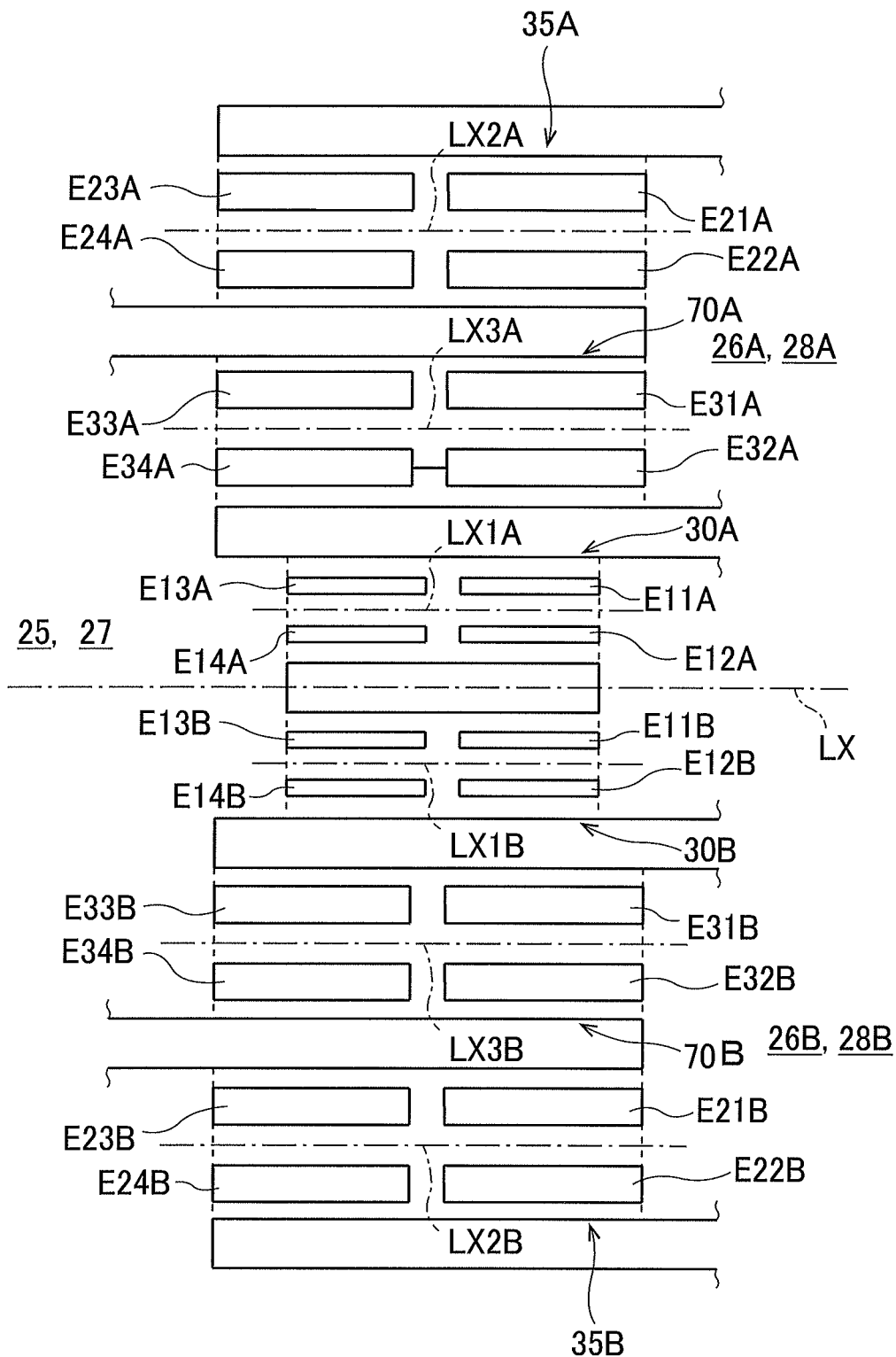
FIG. 14 is a plan view illustrating an example of arrangement of an upper electrode layer provided on each of bridge portions of the power generating element of FIG. 10.

It is preferable that the upper electrode layers E11, E12, E21, and E22 are arranged at positions where a stress is generated at the time of displacement of the weight body 21 (position where the bridge portion itself is deformed) on the bridge portions 30 and 35. In the embodiment illustrated in FIG. 1, the two upper electrode layers E11 and E12 are arranged above the first bridge portion 30 (positive side on the Z-axis), and two upper electrode layers E11 and E12 are arranged at mutually different positions in the X-axis direction. Two upper electrode layers E21 and E22 are arranged above the second bridge portion 35, and two upper electrode layers E21 and E22 are arranged at mutually different positions in the X-axis direction. These four upper electrode layers E11, E12, E21, and E22 are electrically independent from each other. However, the number and arrangement of the upper electrode layers arranged in each of the bridge portions 30 and 35 are optional, and the four upper electrode layers may be arranged above each of the bridge portions 30 and 35 as illustrated in FIG. 14 to be described below.

Figure 17:
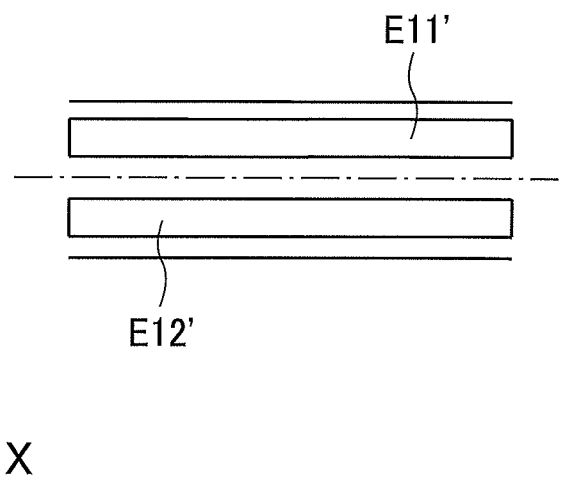
FIG. 17 is a plan view illustrating another example of the upper electrode of the piezoelectric element illustrated in FIG. 10.
Figure 18:
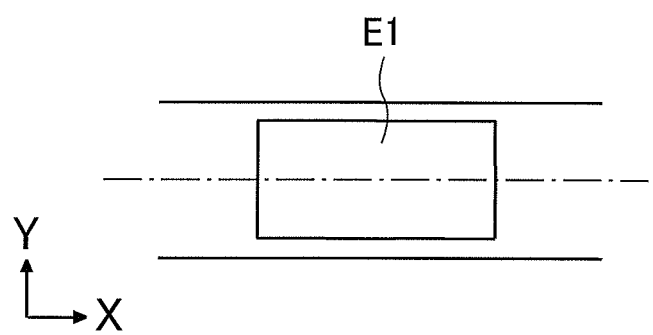
FIG. 18 is a plan view illustrating another example of the upper electrode of the piezoelectric element illustrated in FIG. 10.

Moreover, as illustrated in FIG. 17 to be described below, as long as it is possible to avoid the charge being canceled by simultaneously receiving the compressive stress and the tensile stress, it is allowable to arrange two upper electrode layers E11' and E12' above each of the bridge portions 30 and 35 and arrange the upper electrode layers E11' and E12' at mutually different positions in the Y-axis direction. Furthermore, as illustrated in FIG. 18 to be described below, as long as it is possible to avoid the charge being canceled by simultaneously receiving the compressive stress and the tensile stress, it is possible to arrange one upper electrode layer E1 above each of the bridge portions 30 and 35.

Figure 3:
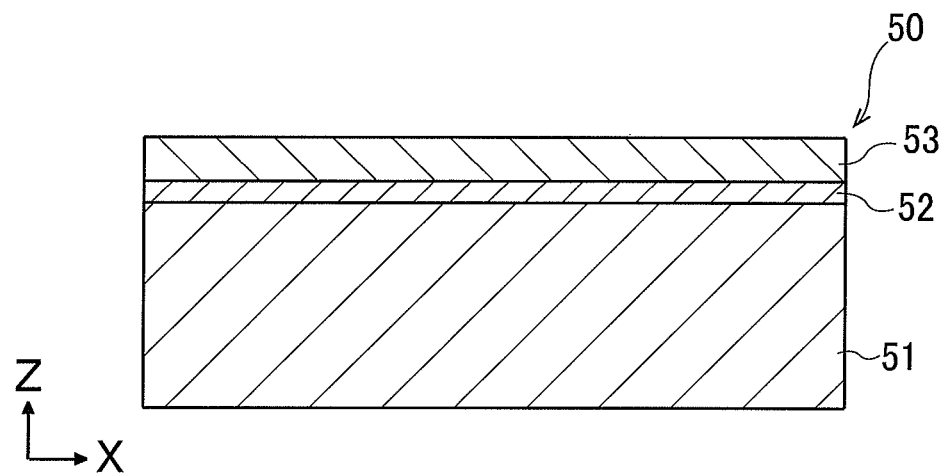
FIG. 3 is a cross-sectional view illustrating an SOI substrate used for manufacturing a power generating element in a method for manufacturing the power generating element illustrated in FIG. 1.

FIG. 3 is a cross-sectional view of an SOI substrate used for manufacturing the power generating element in a method for manufacturing the power generating element illustrated in FIG. 1. A power generating element 1 can be manufactured by etching processing on the SOI substrate 50 illustrated in FIG. 3, for example. The SOI substrate 50 includes a silicon base layer 51, a silicon oxide layer 52 provided on the silicon base layer 51, and a silicon active layer 53 provided on the silicon oxide layer 52, so as to form a laminated substrate having a three-layer structure. This type of SOI substrate 50 is used as a material for manufacturing various semiconductor devices. While the thickness of each of the layers is not particularly limited, an exemplary thickness of the silicon base layer 51 is 625 μm to 725 μm, an exemplary thickness of the silicon oxide layer 52 is 1 μm, and an exemplary thickness of the silicon active layer 53 is 10 μm to 15 μm.

During the etching processing, the silicon active layer 53 is etched from above the SOI substrate 50 to remove unnecessary portion so as to leave a portion to be formed into the first bridge portions 30, the second bridge portion 35, the weight body supporting portion 22, and the bridge supporting portion 13. At this time, the silicon oxide layer 52 functions as an etching stopper.

Moreover, by etching from below the SOI substrate 50, an unnecessary portion of the silicon base layer 51 is removed by etching so as to leave a portion to be formed into the support frame 10 and the weight body 21. In this case, the silicon oxide layer 52 also functions as an etching stopper. In the portion of the silicon base layer 51 where the weight body 21 is to be formed, it is preferable to partially etch (half-etch) the silicon base layer 51. This makes it possible to position the lower surface of the weight body 21 above the lower surface of the support frame 10.

Figure 4:
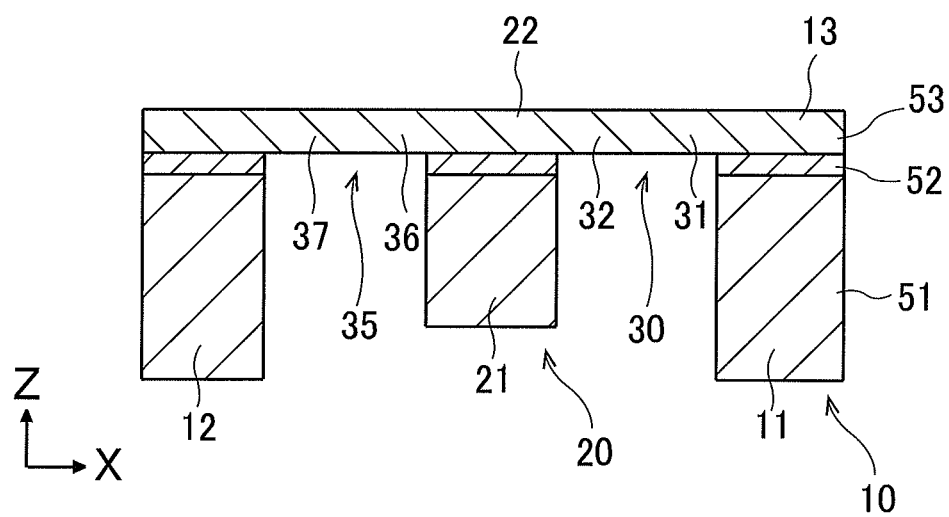
FIG. 4 is a cross-sectional view of a power generating element obtained by etching the SOI substrate illustrated in FIG. 3 in the method of manufacturing the power generating element illustrated in FIG. 1.

Next, an exposed portion of the silicon oxide layer 52 is etched away by etching the silicon active layer 53 and the silicon base layer 51. In this manner, the structure of the power generating element 1 as illustrated in FIG. 4 is obtained. FIG. 4 illustrates a cross-sectional view of a power generating element obtained by etching the SOI substrate illustrated in FIG. 3 in the method of manufacturing the power generating element illustrated in FIG. 1. Herein, each of the support frame 10 and the weight body 21 is formed by the silicon base layer 51 and the silicon oxide layer 52. While the first bridge portion 30, the second bridge portion 35, the weight body supporting portion 22, and the bridge supporting portion 13 are formed by the silicon active layer 53, they may be formed by the silicon active layer 53 and the silicon oxide layer 52.

Thereafter, constituents of the piezoelectric element 40, namely, the lower electrode layer 41, the piezoelectric material layer 42, and the upper electrode layers E11, E12, E21, and E22 are formed on the silicon active layer 53 in this order. In this manner, the power generating element 1 according to the present embodiment can be manufactured.

The method of manufacturing the power generating element 1 is not limited to the above-described method.

Figure 15:
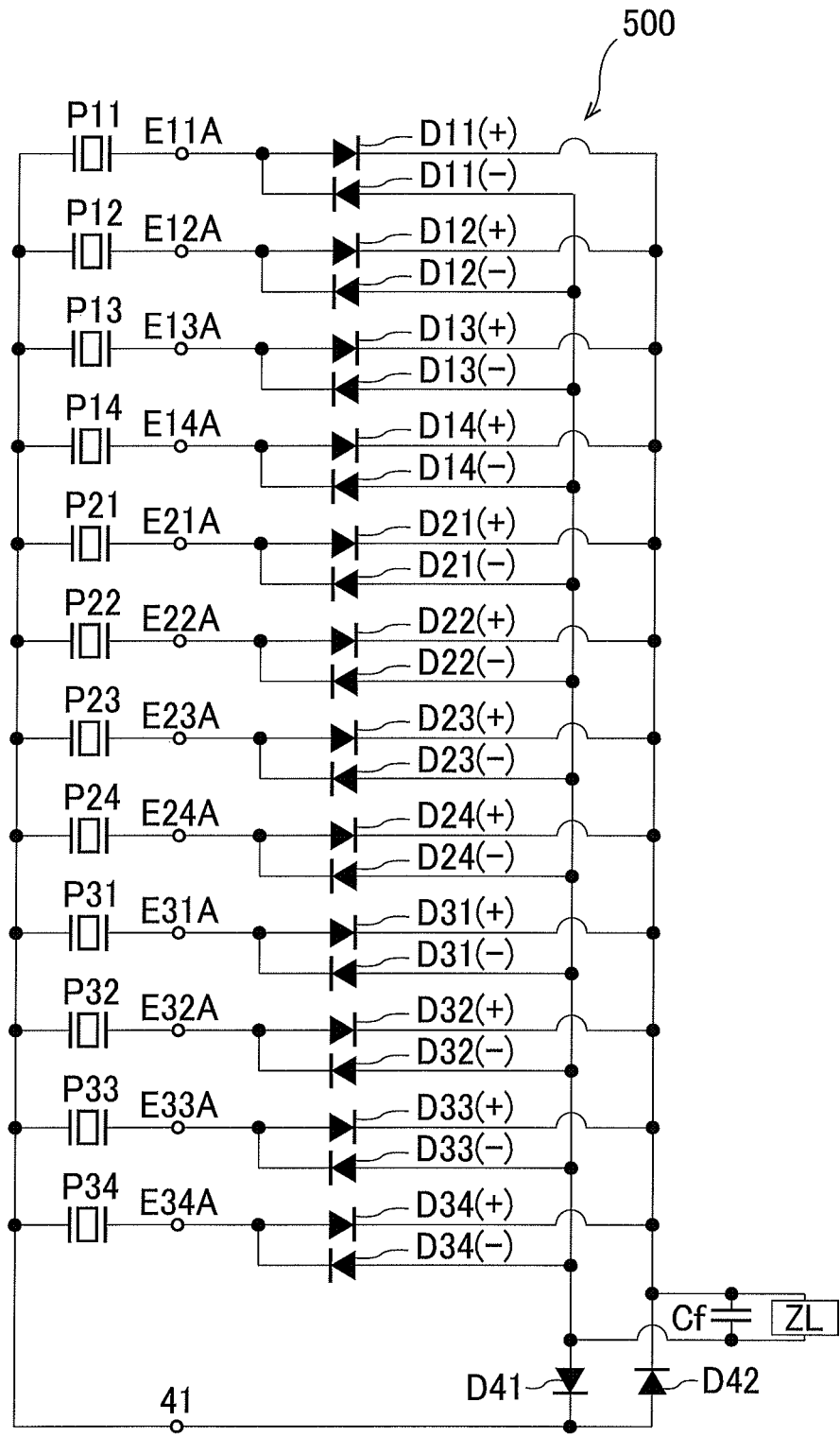
FIG. 15 is a diagram illustrating a configuration of a power generating circuit of the power generating element of FIG. 10.

As illustrated in FIG. 1, the power generating element 1 according to the present embodiment further includes a power generating circuit 55. The power generating circuit 55 is configured to rectify a current based on the charge generated by the piezoelectric element 40 to extract electric power, and supply the extracted electric power to a load ZL (refer to FIG. 15). As illustrated in FIG. 15 to be described below, the power generating circuit 55 can be configured using a rectifying element (diode) and a smoothing capacitative element (capacitor), and thus, a detailed description will be omitted here.

Figure 5:
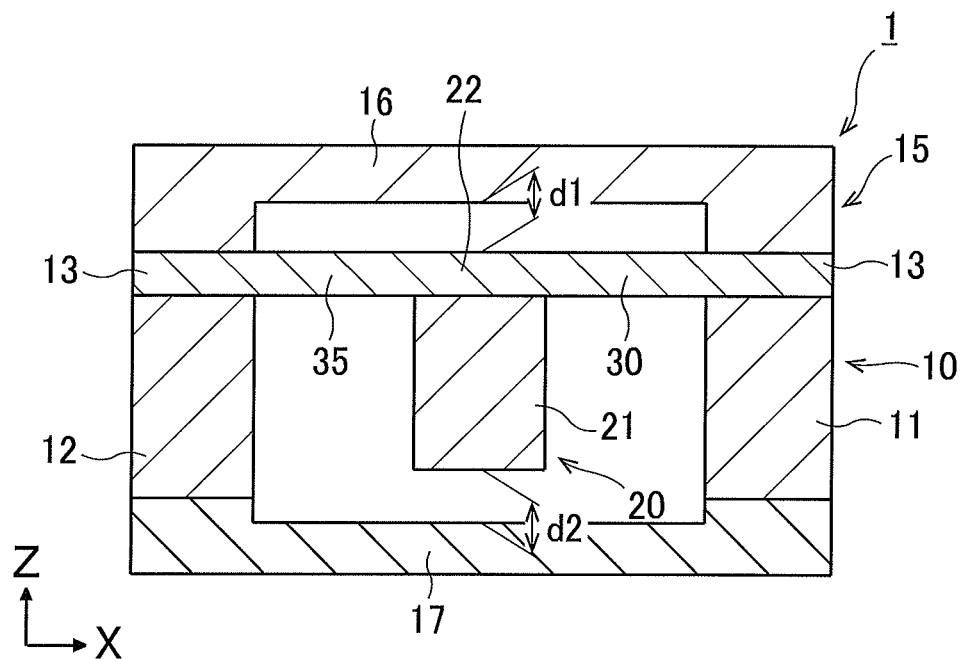
FIG. 5 is a cross-sectional view illustrating the power generating element of FIG. 1 including a casing.

FIG. 5 is a cross-sectional view of the power generating element 1 of FIG. 1, including the casing 15. The support frame 10 described above is a member constituting a portion of the casing 15. That is, the casing 15 includes the support frame 10, a recessed top plate 16 provided above the support frame 10, and a recessed bottom plate 17 provided below the support frame 10. The top plate 16 and the bottom plate 17 are fabricated separately from the support frame 10. The top plate 16 is joined to the upper surface of the support frame 10 via the bridge supporting portion 13, the lower electrode layer 41, and the piezoelectric material layer 42 described above, while the bottom plate 17 is joined to the lower surface of the support frame 10. The above-configured casing 15 accommodates the first bridge portion 30, the second bridge portion 35, and the weight body 21.

The top plate 16 of the casing 15 is formed so as to cover the region inside the support frame 10 from above. The top plate 16 is constituted to allow the weight body 21 to abut the top plate 16 via the weight body supporting portion 22 and functions as a stopper to regulate upward displacement of the weight body 21. When the weight body 21 is in a neutral position, the top plate 16 is spaced apart from the weight body supporting portion 22 by a predetermined distance d1, and the weight body 21 can be displaced upward until the weight body supporting portion 22 abuts the top plate 16. Here, the neutral position is a position in a state where acceleration including gravity is not applied to the weight body, that is, a position of the weight body 21 in a case where the first bridge portion 30 and the second bridge portion 35 are not deflected.

The bottom plate 17 of the casing 15 is formed so as to cover the region inside the support frame 10 from below. The bottom plate 17 is constituted to allow the weight body 21 to abut the bottom plate 17 and functions as a stopper to regulate downward displacement of the weight body 21. When the weight body 21 is in the neutral position, the bottom plate 17 is spaced apart from the weight body 21 by a predetermined distance d2, and the weight body 21 can be displaced downward until it abuts the bottom plate 17.

Figure 6:
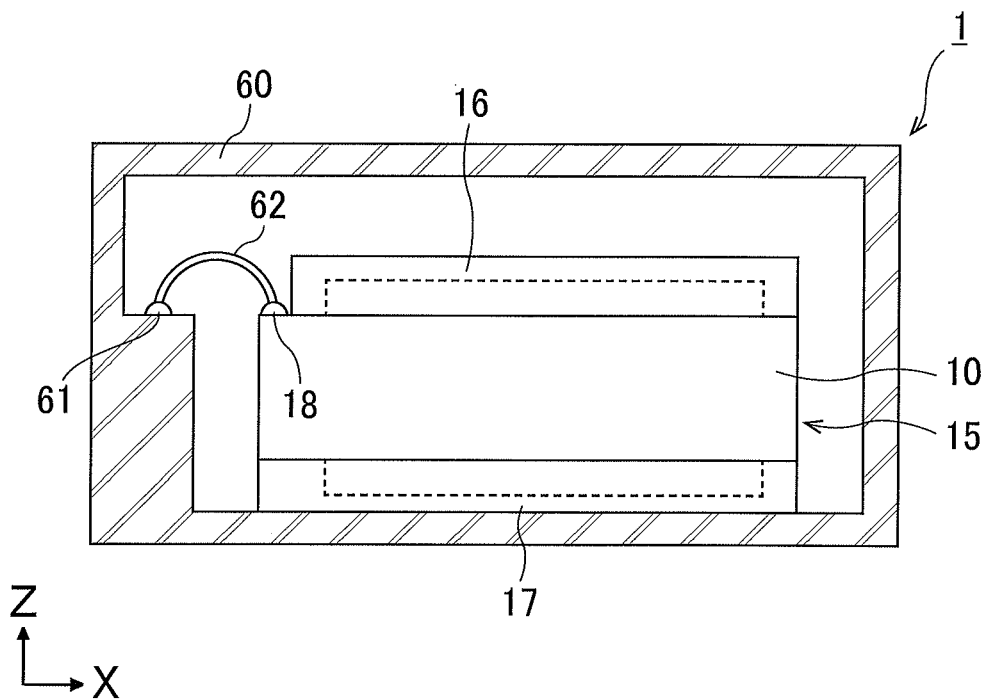
FIG. 6 is a cross-sectional view illustrating the power generating element of FIG. 5 including an outer package.

FIG. 6 is a cross-sectional view of the power generating element 1 of FIG. 5 including an outer package 60. In the power generating element 1 illustrated in FIG. 6, the casing 15 is accommodated in the outer package 60. It is preferable that the power generating circuit 55 described above is provided in the outer package 60. In this case, a bonding pad 18 provided in the casing 15 and a bonding pad 61 provided in the outer package 60 are connected with each other by a bonding wire 62. Here, the casing 15 includes the number of bonding pads which is the total of the number of the upper electrode layers E11, E12, E21, and E22 and the number of the lower electrode layers 41. The outer package 60 also includes the same number of bonding pads 61 as the number of bonding pads 18 provided in the casing 15. The internal space of the outer package 60 may be a hollow space or may be filled with resin, or the like.

Next, actions in the present embodiment having such a configuration will be described.

When external vibration in a vertical direction (Z-axis direction) is applied to the power generating element 1 illustrated in FIG. 1, acceleration in the vertical direction is applied to the weight body 21, so as to allow the weight body 21 to be displaced together with the weight body supporting portion 22 in the vertical direction, resulting in deflection and deformation of the first bridge portion 30 and the second bridge portion 35. When the acceleration is high, the weight body 21 abuts the top plate 16 via the weight body supporting portion 22 or abuts the bottom plate 17. In this manner, displacement of the weight body 21 in the vertical direction is regulated so as to prevent plastic deformation and breakage of the first bridge portion 30 and the second bridge portion 35.

During the deflection of the first bridge portion 30 and the second bridge portion 35, a stress is generated in each of the first bridge portion 30 and the second bridge portion 35. Generation of the stress leads to generation of a charge corresponding to the generated stress, in a portion of the piezoelectric material layer 42 arranged above each of the bridge portions 30 and 35.

Figure 7:
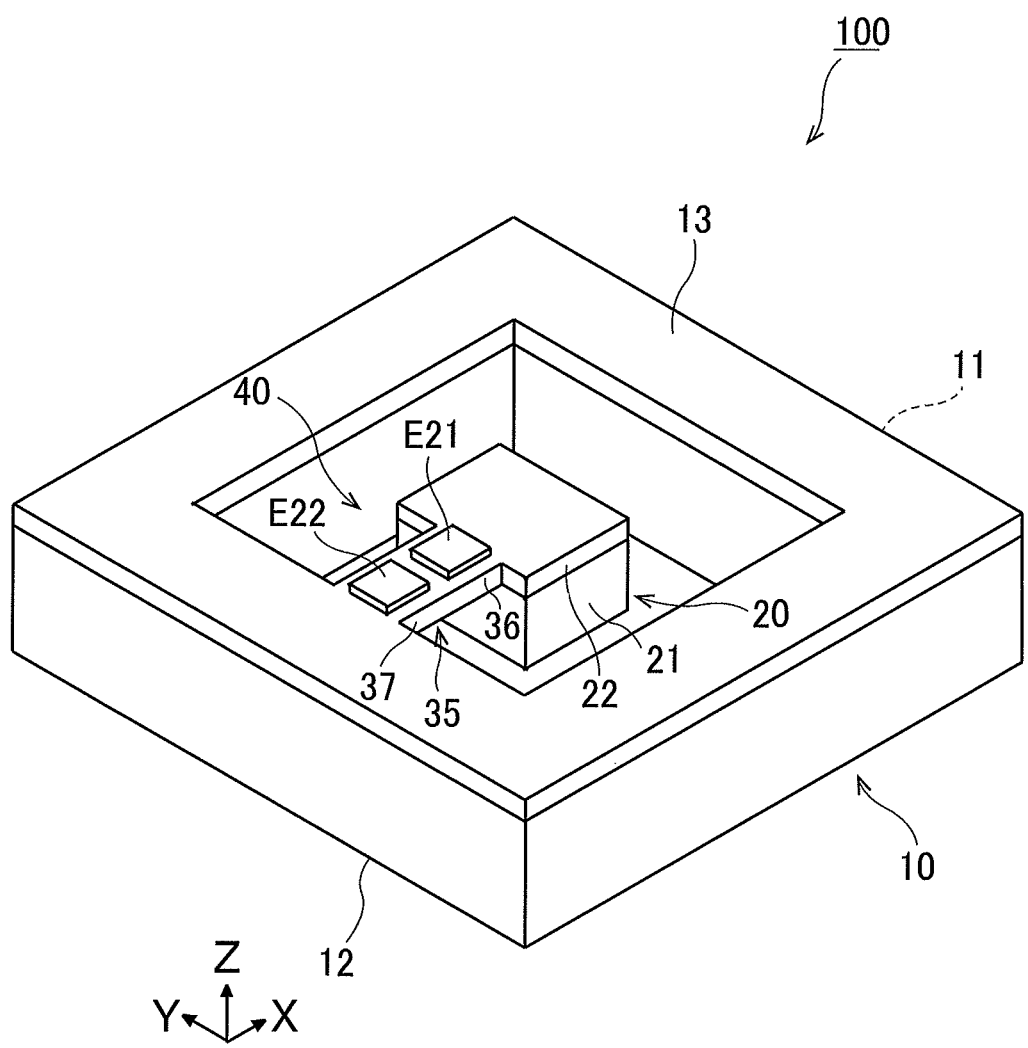
FIG. 7 is a perspective view illustrating an overall configuration of a power generating element as a comparative example of FIG. 1.
Figure 8:
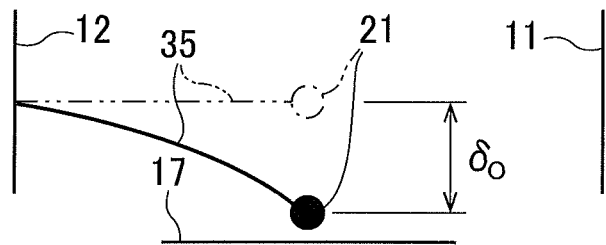
FIG. 8 is a conceptual diagram illustrating a deflection state of a second bridge portion of the power generating element illustrated in FIG. 7.
Figure 9:
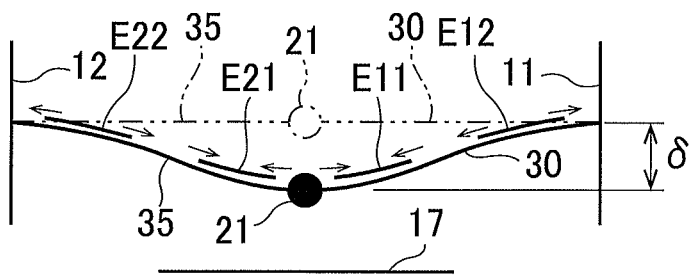
FIG. 9 is a conceptual diagram illustrating a deflection state of a first bridge portion and a second bridge portion of the power generating element in FIG. 1.

Now, a difference from a power generating element 100 having a cantilever structure illustrated in FIG. 7 will be described with reference to FIGS. 7 to 9. FIG. 7 is a perspective view illustrating an overall configuration of a power generating element as a comparative example. The power generating element 100 illustrated in FIG. 7 has a cantilever structure in which the first bridge portion 30 is removed and the weight body 21 is supported by the second bridge portion 35, in contrast to the power generating element 1 illustrated in FIG. 1. FIG. 8 is a schematic model illustrating a deflection state of the second bridge portion 35 during downward displacement of the weight body 21 of the power generating element 100 illustrated in FIG. 7. FIG. 9 is a schematic model illustrating a deflection state of the first bridge portion 30 and the second bridge portion 35 during downward displacement of the weight body 21 of the power generating element 1 illustrated in FIG. 1.

Since the weight body 21 of the power generating element 100 illustrated in FIG. 7 is supported on the support frame 10 by one bridge portion (second bridge portion 35), a displacement $\delta_O$ of the weight body 21 is relatively great as illustrated in FIG. 8. In contrast, the downward displacement of the weight body 21 is regulated by the bottom plate 17 of the casing 15 as described above. With this configuration, while the weight body 21 would not abut the bottom plate 17 with a small displacement of the weight body 21, the weight body 21 would abut the bottom plate 17 when the force received by the weight body 21 increases. That is, the cantilever structure increases the likelihood of displacement of the weight body 21, resulting in an increase in the likelihood of abutment of the weight body 21 against the bottom plate 17 even when the acceleration is not so high. In this case, the force received by the weight body 21 would escape to the bottom plate 17 to reduce the stress generated in the second bridge portion 35. This causes a problem that the vibration energy given to the weight body 21 is partially lost to reduce the charge generated from the piezoelectric element 40.

In contrast, since the weight body 21 of the power generating element 1 illustrated in FIG. 1 is supported on the support frame 10 by the first bridge portion 30 and the second bridge portion 35, as illustrated in FIG. 9, it is possible to reduce the displacement δ of the weight body 21. That is, even when the acceleration applied to the weight body 21 illustrated in FIG. 8 and the acceleration applied to the weight body 21 illustrated in FIG. 9 are the same, the weight body 21 illustrated in FIG. 9 can achieve smaller displacement. This enables expansion of an acceleration range in which the weight body 21 can be displaced without abutting the bottom plate 17 of the casing 15, making it possible to avoid abutment of the weight body 21 to the bottom plate 17 in a wider acceleration range. This makes it possible to suppress an escape of the force received by the weight body 21 to the bottom plate 17, achieving an increase in the stress generated in the first bridge portion 30 and the second bridge portion 35. As a result, the vibration energy applied to the weight body 21 can be efficiently converted into electric energy, achieving an increase in the charge generated from the piezoelectric element 40.

The generated charges are supplied from the upper electrode layers E11, E12, E21, and E22 of the piezoelectric element 40 to the power generating circuit 55 (refer to FIG. 15) and are smoothed by the power generating circuit 55. The smoothed electric power is supplied to the load ZL. More specifically, charges are generated in the upper electrode layers E11 and E12 due to the stress generated in the first bridge portion 30. As illustrated in FIG. 9, the upper electrode layer E11 is arranged at a position where compressive stress is generated on the first bridge portion 30, while the upper electrode layer E12 is arranged at a position where tensile stress is generated on the first bridge portion 30. This makes it possible to avoid the canceling of the charge due to simultaneous reception of the compressive stress and the tensile stress at one upper electrode layer, leading to generation of the charge efficiently from the stress in the first bridge portion 30. Similarly, it is possible to efficiently generate charges in the upper electrode layers E21 and E22 by the stress generated in the second bridge portion 35.

Meanwhile, the vibration direction of the external vibration generatable by the power generating element 1 according to the present embodiment is not limited to the vertical direction (Z-axis direction), and it is possible to perform three-axis power generation.

For example, when external vibration in the X-axis direction is applied, the weight body 21 swings in the XZ plane. For example, when acceleration to the X-axis positive side is applied to the weight body 21, the weight body 21 swings so as to allow the lower end of the weight body 21 to deflect toward the positive side on the X-axis. This generates deflection in the first bridge portion 30 and the second bridge portion 35 to generate a stress, making it possible to generate a charge from the piezoelectric element 40. When external vibration in the X-axis direction is applied, it is possible to efficiently generate charges by arranging the upper electrode layers E11, E12, E21, and E22 as illustrated in FIG. 1.

Moreover, when external vibration in the Y-axis direction is applied, the weight body 21 swings in the YZ plane. For example, when acceleration to the Y-axis positive side is applied to the weight body 21, the weight body 21 swings to allow the lower end of the weight body 21 to deflect toward the positive side on the Y-axis. This generates deflection in the first bridge portion 30 and the second bridge portion 35 to generate a stress, making it possible to generate a charge from the piezoelectric element 40. When external vibration in the Y-axis direction is applied, it is preferable that four upper electrode layers are arranged above each of the bridge portions 30 and 35 as described below in FIG. 14. This makes it possible to generate a charge efficiently by the stress generated in each of the bridge portions 30 and 35.

Since the weight body 21 is supported on the support frame 10 by the first bridge portion 30 and the second bridge portion 35 even in a case where external vibration is applied in the X-axis direction and the Y-axis direction as described above, it is possible to reduce the displacement of the weight body 21.

In this manner, according to the present embodiment, the weight body 21 provided inside the support frame 10 is supported on the first frame portion 11 of the support frame 10 by the first bridge portion 30, while being supported on the second frame portion 12 of the support frame 10 by the second bridge portion 35. This makes it possible to suppress the amount of displacement of the weight body 21 when external vibration is applied, and to avoid abutment of the weight body 21 to the top plate 16 and the bottom plate 17 of the casing 15 in a wider acceleration range. With this configuration, it is possible to suppress an escape of the force received by the weight body 21 to the top plate 16 and the bottom plate 17 and increase the stress generated in the first bridge portion 30 and the second bridge portion 35, leading to an increase in the charge generated from the piezoelectric element 40. As a result, it is possible to suppress the displacement of the weight body 21 and increase the power generation amount.

Moreover, according to the present embodiment, since the weight body 21 is supported by the first bridge portion 30 and the second bridge portion 35, it is possible suppress an occurrence of warpage in the first bridge portion 30 and the second bridge portion 35. In contrast, in a case where the power generating element 100 has a cantilever structure as illustrated in FIG. 7, the lower electrode layer 41, the piezoelectric material layer 42, and the upper electrode layers E21 and E22 are laminated on the second bridge portion 35, leading to the possibility of generation of warpage in the first bridge portion 30 due to a difference in a linear expansion coefficient of each of the layers. The X-axis positive side end 36 of the second bridge portion 35 becomes a free end, leading to an increased warpage in some cases. This might hinder the element from being accommodated in the semiconductor manufacturing apparatus, which is not preferable in view of the manufacturing process. In contrast, since the power generating element 1 according to the present embodiment has a double-supported beam structure, it is possible to reduce the warpage generated in the first bridge portion 30 and the second bridge portion 35, which is advantageous in terms of manufacturing.

In the above-described embodiment, the example in which the upper electrode layer is provided on the upper surface of the first bridge portion 30 and the upper surface of the second bridge portion 35 has been described. This is not a limitation, however, and the upper electrode layer need not be provided on the first bridge portion 30 or need not be provided on the second bridge portion 35.

The above-described embodiment is an exemplary case in which the piezoelectric element 40 is used as the charge generating element. It is not, however, limited to the use of the piezoelectric element 40 as long as a charge can be generated at the time of displacement of the vibrating body 20, and electret or the like may be used, for example.

Second Embodiment

Next, a power generating element according to a second embodiment of the present invention will be described with reference to FIGS. 10 to 18.

In the second embodiment illustrated in FIGS. 10 to 18, a main difference is in that the vibrating body includes a first weight body coupled to the first bridge portion, a second weight body coupled to the second bridge portion, and a third bridge portion coupling the first weight body with the second weight body. The other configurations are substantially the same as the case of the first embodiment illustrated in FIGS. 1 to 9. In FIGS. 10 to 18, the same portions as those of the first embodiment illustrated in FIGS. 1 to 9 will be denoted by the same reference numerals, and a detailed description thereof will be omitted.

Figure 10:
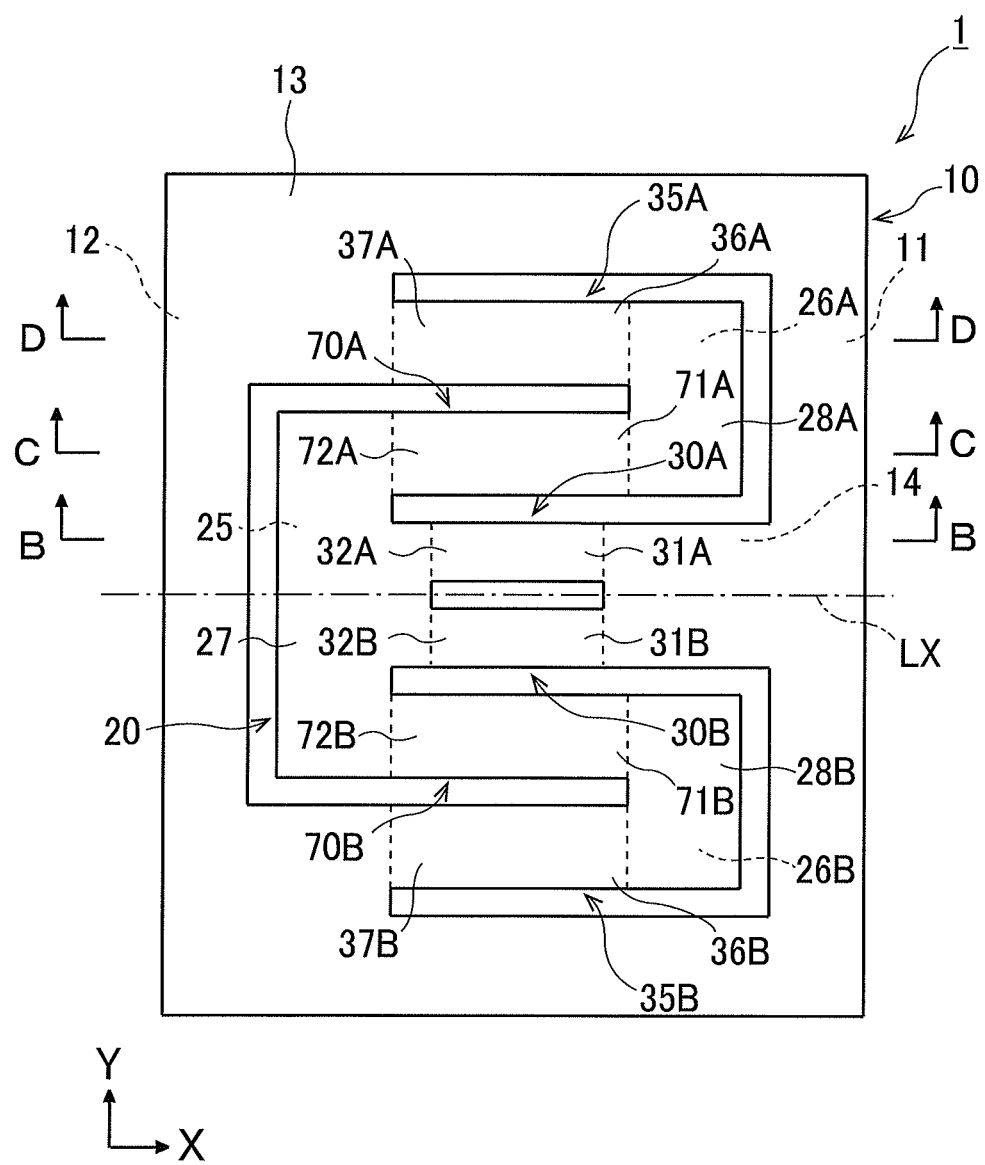
FIG. 10 is a top view illustrating a power generating element according to a second embodiment of the present invention.

FIG. 10 is a top view of a power generating element according to the second embodiment of the present invention. In the present embodiment, as illustrated in FIG. 10, the vibrating body 20 is supported on the support frame 10 by two first bridge portions 30A and 30B and two second bridge portions 35A and 35B. The vibrating body 20 includes a first weight body 25 coupled to the two first bridge portions 30A and 30B, two second weight bodies 26A and 26B coupled to the corresponding second bridge portions 35A and 35B, and two third bridge portions 70A and 70B coupling the first weight body 25 with the corresponding second weight body 26. The second weight bodies 26A and 26B are spaced apart from each other and also apart from the first weight body 25.

In the present embodiment, the second weight bodies 26A and 26B and the second bridge portions 35A and 35B are arranged on both sides of the two first bridge portions 30A and 30B in the Y-axis direction in plan view. Each of the third bridge portions 70A and 70B is arranged between the adjacent first bridge portions 30A and 30B and the adjacent second bridge portions 35A and 35B in the Y-axis direction, respectively. More specifically, one first bridge portion 30A is arranged on positive side on the Y-axis and the other first bridge portion 30B is arranged on the negative side on the Y-axis. One of the second bridge portions 35A is arranged more toward the positive side on the Y-axis than the first bridge portion 30A arranged on the positive side on the Y-axis. The other second bridge portion 35B is arranged more toward the negative side on Y-axis than the second bridge portion 35B arranged on the negative side on the Y-axis. One third bridge portions 70A is arranged between the first bridge portion 30A arranged on the positive side on the Y-axis and the second bridge portion 35A arranged on the positive side on the Y-axis. The other third bridge portion 70B is arranged between the first bridge portion 30B arranged on the negative side on the Y-axis and the second bridge portion 35B arranged on the negative side on the Y-axis. Each of the third bridge portions 70A and 70B is spaced apart from each of the adjacent first bridge portions 30A and 30B and also spaced apart from each of the adjacent second bridge portions 35A and 35B, respectively.

The support frame 10 has a protrusion 14 interposed between the first frame portion 11 and the first bridge portions 30A and 30B. The protrusion 14 is a portion protruding from the first frame portion 11 in the negative side on the X-axis toward the first bridge portions 30A and 30B.

The two first bridge portions 30A and 30B are arranged on the first frame portion 11 side of the support frame 10 with respect to the first weight body 25 and couple the first weight body 25 with the first frame portion 11. More specifically, the X-axis positive side ends 31A and 31B of the first bridge portions 30A and 30B are coupled to the first frame portion 11 via the protrusion 14, while the X-axis negative side ends 32A and 32B of the first bridge portions 30A and 30B are coupled to the first weight body 25. The first bridge portions 30A and 30B linearly extend in the X-axis direction between the first weight body 25 and the protrusion 14 to support the first weight body 25 on the first frame portion 11 via the protrusion 14.

The second bridge portions 35A and 35B are arranged on the second frame portion 12 side of the support frame 10 with respect to the corresponding second weight bodies 26A and 26B, and couple the second weight bodies 26A and 26B with the second frame portion 12. More specifically, the X-axis positive side ends 36A and 36B of the second bridge portions 35A and 35B are coupled to the corresponding second weight bodies 26A and 26B, respectively, while the X-axis negative side ends 37A and 37B of the second bridge portions 35A and 35B are coupled to the second frame portion 12. The second bridge portions 35A and 35B linearly extend in the X-axis direction along the first bridge portions 30A and 30B between the second weight bodies 26A and 26B and the second frame portion 12 so as to support the second weight bodies 26A and 26B on the second frame portion 12, respectively.

The third bridge portions 70A and 70B are arranged between the first weight body 25 and the corresponding second weight bodies 26A and 26B, respectively in the X-axis direction, so as to couple the first weight body 25 with the corresponding second weight bodies 26A and 26B. More specifically, the X-axis positive side ends 71A and 71B of the third bridge portions 70A and 70B are coupled to the corresponding second weight bodies 26A and 26B, respectively, while the X-axis negative side ends 72A and 72B of the third bridge portions 70A and 70B are coupled to the first weight body 25. The third bridge portions 70A and 70B linearly extend in the X-axis direction along the first bridge portions 30A and 30B and the second bridge portions 35A and 35B, respectively. The first bridge portions 30A and 30B, the second bridge portions 35A and 35B, and the third bridge portions 70A and 70B are parallel to each other.

The first weight body 25 is formed so as to extend in the Y-axis direction to be coupled with the X-axis negative side ends 32A and 32B of the first bridge portions 30A and 30B and with the X-axis negative side ends 72A and 72B of the third bridge portions 70A and 70B. The first weight body 25 is spaced apart from the support frame 10.

A first weight body supporting portion 27 is provided on the upper surface of the first weight body 25. The first weight body supporting portion 27 extends from the first bridge portions 30A and 30B to the upper surface of the first weight body 25 and is integrally and continuously formed with the first bridge portions 30A and 30B and the third bridge portions 70A and 70B. The first weight body supporting portion 27 is formed on the entire upper surface of the first weight body 25, and the first weight body 25 is joined to the lower surface of the first weight body supporting portion 27 and is supported by the first weight body supporting portion 27. With this configuration, the first weight body 25 is coupled to the X-axis negative side ends 32A and 32B of the first bridge portions 30A and 30B and to the X-axis negative side ends 72A and 72B of the third bridge portions 70A and 70B via the first weight body supporting portion 27. In this manner, the first weight body 25 is supported by the first bridge portions 30A and 30B and the third bridge portions 70A and 70B via the first weight body supporting portion 27.

Figure 11:
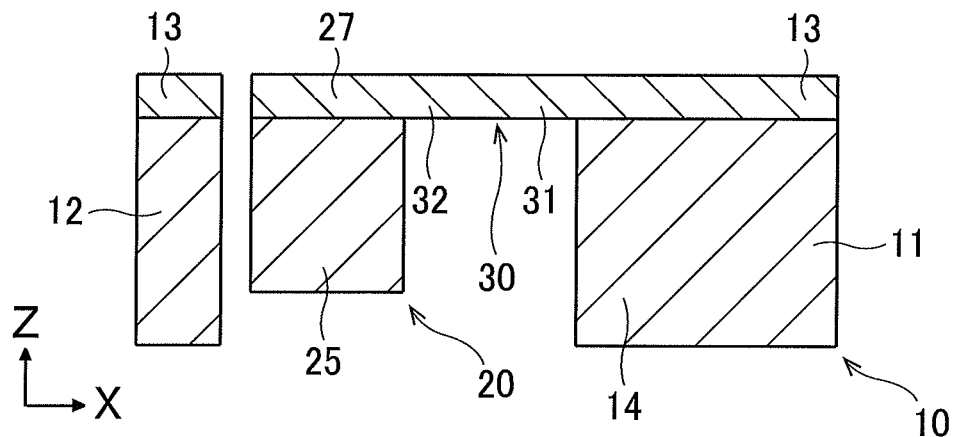
FIG. 11 is a cross-sectional view taken along line B-B of FIG. 10.
Figure 12:
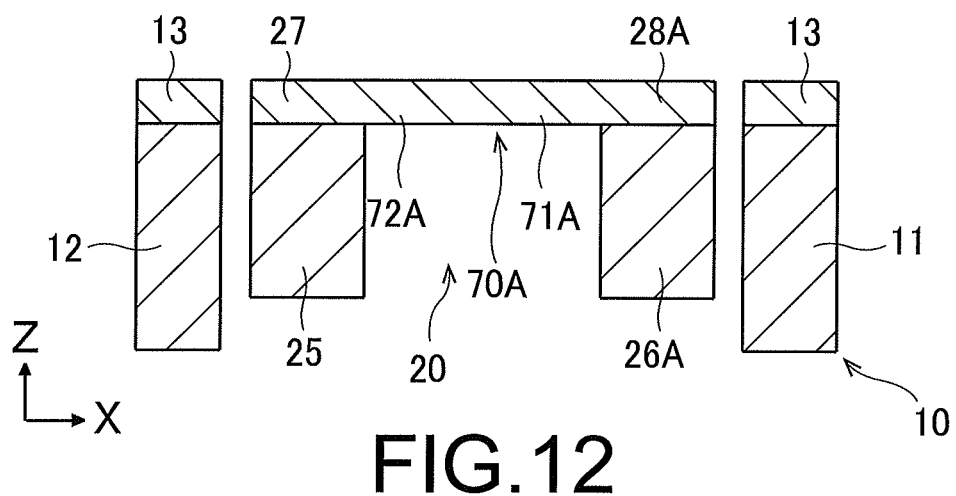
FIG. 12 is a cross-sectional view taken along line C-C of FIG. 10.

FIG. 11 is a cross-sectional view taken along line B-B of FIG. 10, and FIG. 12 is a cross-sectional view taken along line C-C of FIG. 10. As illustrated in FIGS. 11 and 12, the lower surface of the first weight body 25 is positioned above the lower surface of the support frame 10. The first weight body 25 can be displaced downward until it abuts the bottom plate 17 of the casing 15 described below.

As illustrated in FIG. 10, the second weight bodies 26A and 26B are formed so as to extend in the Y-axis direction to be coupled with the X-axis positive side ends 36A and 36B of the corresponding second bridge portions 35A and 35B and coupled with the X-axis positive side ends 71A and 71B of the corresponding third bridge portions 70A and 70B, respectively. The second weight bodies 26A and 26B are spaced apart from the support frame 10.

Second weight body supporting portions 28A and 28B are provided on the upper surfaces of the second weight bodies 26A and 26B, respectively. The second weight body supporting portions 28A and 28B extend from the corresponding second bridge portions 35A and 35B to the upper surfaces of the second weight bodies 26A and 26B, respectively, to be integrally and continuously formed with the corresponding second bridge portions 35A and 35B and the corresponding third bridge portions 70A and 70B, respectively. The second weight body supporting portions 28A and 28B are formed on the entire upper surface of the second weight bodies 26A and 26B, respectively. The second weight bodies 26A and 26B are joined to the lower surfaces of the second weight body supporting portions 28A and 28B and to be supported by the second weight body supporting portions 28A and 28B, respectively. With this configuration, the second weight bodies 26A and 26B are coupled to the X-axis positive side ends 36A and 36B of the corresponding second bridge portions 35A and 35B and to the X-axis positive side ends 71A and 71B of the corresponding third bridge portions 70A and 70B, via the second weight body supporting portions 28A and 28B, respectively. In this manner, the second weight bodies 26A and 26B are supported on the second bridge portions 35A and 35B and the third bridge portions 70A and 70B via the second weight body supporting portions 28A and 28B.

Figure 13:
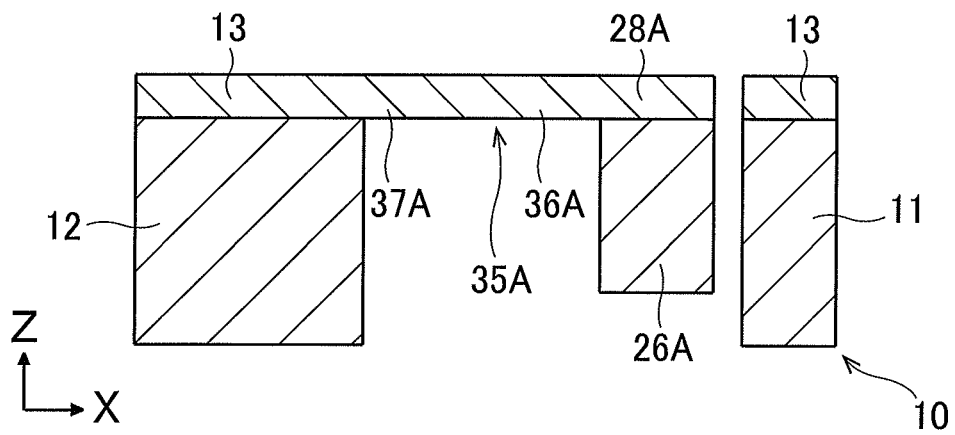
FIG. 13 is a cross-sectional view taken along line D-D of FIG. 10.

FIG. 13 is a cross-sectional view taken along line D-D of FIG. 10. As illustrated in FIGS. 12 and 13, the lower surfaces of the second weight bodies 26A and 26B are positioned above the lower surface of the support frame 10. The second weight bodies 26A and 26B can be displaced downward until they abut the bottom plate 17 of the casing 15 described below.

The bridge supporting portion 13 provided on the upper surface of the support frame 10 is integrally and continuously formed with the first bridge portions 30A and 30B and the second bridge portions 35A and 35B, on the entire upper surface of the support frame 10. The bridge supporting portion 13 is joined to the upper surface of the support frame 10, and the bridge portions 30A, 30B, 35A and 35B are supported by the support frame 10 via the bridge supporting portion 13.

FIG. 14 is a plan view of an example of a piezoelectric element provided on each of the bridge portions 30A, 30B, 35A, 35B, 70A, and 70B of the power generating element of FIG. 10. As illustrated in FIG. 14, the piezoelectric element 40 according to the present embodiment includes: the lower electrode layer 41 provided on each of the bridge portions 30A, 30B, 35A, 35B, 70A, and 70B; the piezoelectric material layer 42 provided on the lower electrode layer 41; and a plurality of upper electrode layers E11A to E34A and E11B to E34B, provided on the piezoelectric material layer 42. Among them, the lower electrode layer 41 is provided over the entire upper surfaces of the first bridge portions 30A and 30B, the entire upper surfaces of the second bridge portions 35A and 35B, the entire upper surfaces of the third bridge portions 70A and 70B, the entire upper surface of the first weight body supporting portion 27, the entire upper surfaces of the second weight body supporting portions 28A and 28B, and the entire upper surface of the bridge supporting portion 13, being integrally formed. Note that there is no need to provide the lower electrode layer 41 on the upper surface of the bridge supporting portion 13. The piezoelectric material layer 42 is provided over the entire upper surface of the lower electrode layer 41. For clarity of the drawings, the lower electrode layer 41, the piezoelectric material layer 42, and the upper electrode layers E11A to E34A and E11B to E34B are omitted in FIG. 10, and the lower electrode layer 41 and the piezoelectric material layer 42 are omitted in FIG. 14.

It is preferable that the upper electrode layers E11A to E34A and E11B to E34B are arranged at positions where a stress is generated at the time of displacement of the weight bodies 25, 26A and 26B (positions where bridge portions themselves are deformed) of the bridge portions 30A, 30B, 35A, 35B, 70A, and 70B. In the embodiment illustrated in FIG. 14, the four upper electrode layers E11A to E14A and E11B to E14B are arranged above each of the first bridge portions 30A and 30B. Among them, the upper electrode layers E11A, E12A, E11B, and E12B are arranged on the positive side on the X-axis, while the other upper electrode layers E13A, E14A, E13B, and E14B are arranged on the negative side on the X-axis. Moreover, the upper electrode layers E11A, E13A, E11B, and E13B are arranged on the positive side on the Y-axis, while the upper electrode layers E12A, E14A, E12B, and E14B are arranged on the negative side on the Y-axis. The upper electrode layers E11A to E14A are electrically independent from each other, and the same applies to E11B to E14B.

Four upper electrode layers E21A to E24A and E21B to E24B are arranged above each of the second bridge portions 35A and 35B, respectively. Among them, the upper electrode layers E21A, E22A, E21B, and E22B are arranged on the positive side on the X-axis, while the other upper electrode layers E23A, E24A, E23B, and E24B are arranged on the negative side on the X-axis. Moreover, the upper electrode layers E21A, E23A, E21B, and E23B are arranged on the positive side on the Y-axis, while the upper electrode layers E22A, E24A, E22B, and E24B are arranged on the negative side on the Y-axis. The upper electrode layers E21A to E24A are electrically independent from each other, and the same applies to E21B to E24B.

Four upper electrode layers E31A to E34A and E31B to E34B are arranged above each of the third bridge portions 70A and 70B, respectively. Among them, the upper electrode layers E31A, E32A, E31B, and E32B are arranged on the positive side on the X-axis, while the other upper electrode layers E33A, E34A, E33B, and E34B are arranged on the negative side on the X-axis. Moreover, the upper electrode layers E31A, E33A, E31B, and E33B are arranged on the positive side on the Y-axis, while the upper electrode layers E32A, E34A, E32B, and E34B are arranged on the negative side on the Y-axis. The upper electrode layers E31A to E34A are electrically independent from each other, and the same applies to E31B to E34B.

This power generating element 1 can be manufactured similarly to the power generating element 1 illustrated in FIG. 1.

FIG. 15 illustrates a configuration of the power generating circuit of the power generating element in FIG. 10. The power generating circuit 55 according to the present embodiment can be configured as illustrated in FIG. 15, for example. In FIG. 15, each of P11 to P34 corresponds to a portion of the piezoelectric material layer 42 positioned below each of the upper electrode layers E11A to E34A, respectively. The vertical lines illustrated on the left side of P11 to P34 correspond to the common lower electrode layer 41 while the vertical lines illustrated on the right side of P11 to P34 correspond to the corresponding upper electrode layers E11A to E34A. In FIG. 15, in order to simplify the drawing, P11 to P34 are illustrated as portions of the piezoelectric material layer 42 corresponding to: four upper electrode layers E11A to E14A corresponding to one first bridge portion 30A; four upper electrode layers E21A to E24A corresponding to one second bridge portion 35A; and four upper electrode layers E31A to E34A corresponding to one of the third bridge portions 70A and 70B. While the portions of the piezoelectric material layer 42 corresponding to the four upper electrode layers E11B to E14B corresponding to the other first bridge portion 30B, four upper electrode layers E21B to E24B corresponding to the other second bridge portion 35B, and four upper electrode layers E31B to E34B corresponding to the other third bridge portions 70A and 70B are omitted, these portions of the piezoelectric material layer 42 can also constitute a circuit to extract a charge in a similar manner as described below.

A power generating circuit 500 includes a rectifying element (diode) and a smoothing capacitative element (capacitor). Among these, each of rectifying elements D11(+) to D34(+) has a function of extracting a positive charge generated in each of the upper electrode layers E11A to E34A, respectively. Moreover, each of rectifying elements D11(−) to D34(−) has a function of extracting a negative charge generated in each of the upper electrode layers E11A to E34A, respectively.

The positive charges extracted by the rectifying elements D11(+) to D34(+) are supplied to a positive electrode (electrode on the upper side in FIG. 15) of the smoothing capacitative element Cf, and the negative charges extracted by the rectifying elements D11(−) to D34(−) are supplied to a negative electrode (electrode on the lower side in FIG. 15). The capacitative element Cf has a function of smoothing a pulsating flow of the generated charge. Moreover, rectifying elements D41(+) and D41(−) facing in opposite directions are connected as rectifying elements between the both electrodes of the capacitative element Cf and the lower electrode layer 41.

The ZL connected in parallel to the capacitative element Cf indicates a load of the equipment that receives the supply of the electric power generated by the power generating element 1. Positive charges extracted by the rectifying elements D11(+) to D34(+) and the negative charges extracted by the rectifying elements D11(−) to D34(−) are supplied to the load ZL. Therefore, in principle, it would be possible to enhance power generation efficiency by equalizing the total amount of positive charges and the total amount of negative charges generated in each of the upper electrode layers E11A to E34A and E11B to E34B to be equal to the total amount of negative charges at each of individual instances.

Therefore, it is preferable that the first bridge portions 30A and 30B, the second bridge portions 35A and 35B, and the vibrating body 20 of the power generating element 1 illustrated in FIG. 10 are plane-symmetrical with respect to a plane parallel to the Z-axis including a center axis LX extending in the X-axis direction of the first weight body 25. In addition, it is preferable that the four upper electrode layers E11A to E14A arranged above the first bridge portion 30A are plane-symmetrical with respect to a plane parallel to the Z-axis including a center axis LX1A extending in the X-axis direction of the first bridge portion 30A, and it is preferable that the four upper electrode layers E11B to E14B arranged above the first bridge portion 30B are plane-symmetrical with respect to a plane parallel to the Z-axis including a center axis LX1B extending in the X-axis direction of the first bridge portion 30B. Moreover, it is preferable that the four upper electrode layers E21A to E24A arranged above the second bridge portion 35A are plane-symmetrical with respect to a plane parallel to the Z-axis including a center axis LX2A extending in the X-axis direction of the second bridge portion 35A, and it is preferable that the four upper electrode layers E21B to E24B arranged above the second bridge portion 35B are plane-symmetrical with respect to a plane parallel to the Z-axis including a center axis LX2B extending in the X-axis direction of the second bridge portion 35B. Furthermore, it is preferable that the four upper electrode layers E31A to E34A arranged above the third bridge portion 70A are plane-symmetrical with respect to a plane parallel to the Z-axis including a center axis LX3A extending in the X-axis direction of the third bridge portion 70A, and it is preferable that the four upper electrode layers E31B to E34B arranged above the third bridge portion 70B are plane-symmetrical with respect to a plane parallel to the Z-axis including a center axis LX3B extending in the X-axis direction of the third bridge portion 70B.

Figure 16:
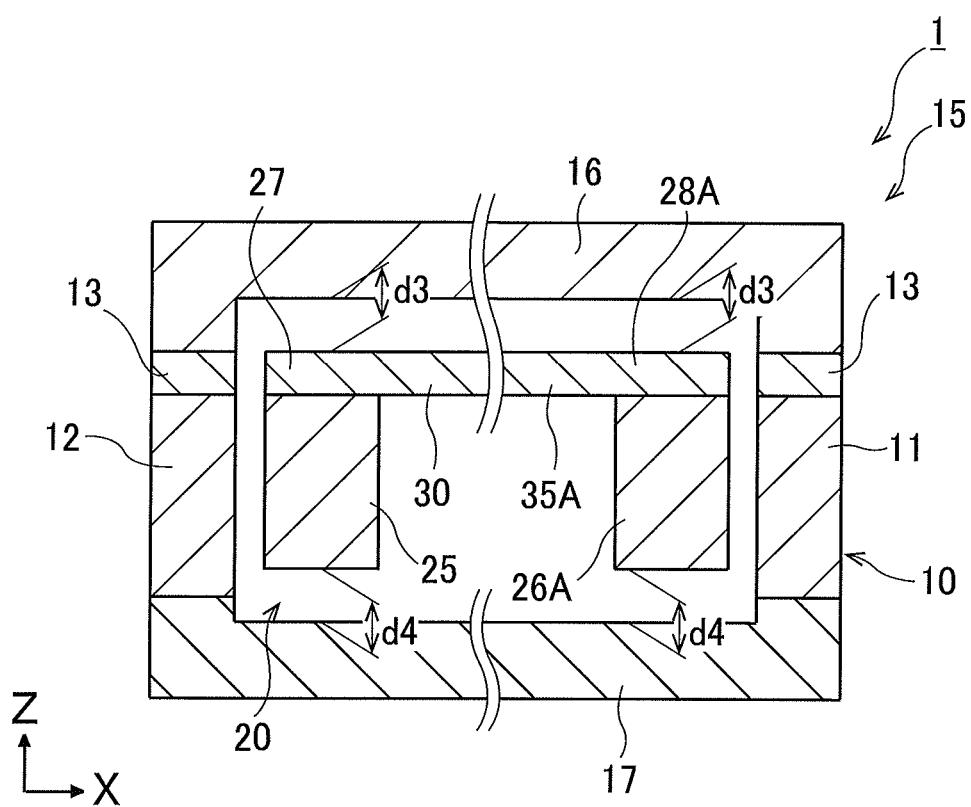
FIG. 16 is a cross-sectional view illustrating the power generating element of FIG. 10 including a casing, corresponding to a cross section formed by combining the B-B cross section and the D-D cross section of FIG. 10.

FIG. 16 is a cross-sectional view of the power generating element 1 of FIG. 10 including the casing 15. The left side of FIG. 16 illustrates a cross sectional shape corresponding to the B-B cross section of FIG. 10, while the right side of FIG. 16 illustrates a cross sectional shape corresponding to the D-D cross section of FIG. 10. Since this casing 15 may be configured in a manner similar to the casing 15 illustrated in FIG. 5, the detailed description will be omitted here.

The top plate 16 of the casing 15 is constituted to allow the first weight body 25 to abut the top plate 16 via the first weight body supporting portion 27 and to allow the second weight bodies 26A and 26B to abut the top plate 16 via the second weight body supporting portions 28A and 28B, respectively, and has a function as a stopper to regulate upward displacement of the first weight body 25 and the second weight bodies 26A and 26B. When the first weight body 25 is in a neutral position, the top plate 16 is spaced apart from the first weight body supporting portion 27 by a predetermined distance d3, and the first weight body 25 can be displaced upward until the first weight body supporting portion 27 abuts the top plate 16. Similarly, when the second weight bodies 26A and 26B are in neutral positions, the top plate 16 is spaced apart from the second weight body supporting portions 28A and 28B by the predetermined distance d3, and the second weight bodies 26A and 26B can be displaced upward until the second weight body supporting portions 28A and 28B abut the top plate 16.

The bottom plate 17 of the casing 15 is configured to allow the first weight body 25 and the second weight bodies 26A and 26B to abut the bottom plate 17 and has a function as a stopper to regulate downward displacement of the first weight body 25 and the second weight bodies 26A and 26B. When the first weight body 25 is in the neutral position, the bottom plate 17 is spaced apart from the first weight body 25 by a predetermined distance d4, and the first weight body 25 can be displaced downward until it abuts the bottom plate 17. Similarly, when the second weight bodies 26A and 26B are in the neutral positions, the bottom plate 17 is spaced apart from the second weight bodies 26A and 26B by a predetermined distance d4, and the second weight bodies 26A and 26B can be displaced downward until they abut the bottom plate 17.

Such a power generating element 1 can include the outer package 60 as illustrated in FIG. 6. In this case, the casing 15 is accommodated in the outer package 60. This outer package 60 can be configured similarly to the outer package 60 illustrated in FIG. 5, and thus a detailed description thereof will be omitted here.

Next, actions in the present embodiment having such a configuration will be described.

When external vibration in the vertical direction is applied to the power generating element 1 illustrated in FIGS. 10 to 13, acceleration in the vertical direction is applied to the first weight body 25 and the second weight bodies 26A and 26B to displace the first weight the body 25 and the second weight bodies 26A and 26B in the vertical direction, resulting in deflection and deformation of the first bridge portions 30A and 30B and the second bridge portions 35A and 35B. The third bridge portions 70A and 70B are deformed while deflecting and displacing in the vertical direction in accordance with the displacement of the first weight body 25 and the second weight bodies 26A and 26B. When the acceleration is high, the first weight body 25 abuts the top plate 16 or abuts the bottom plate 17, and the second weight bodies 26A and 26B abut the top plate 16 or abut the bottom plate 17. In this manner, the displacement of the first weight body 25 and the second weight bodies 26A and 26B is regulated so as to prevent plastic deformation and breakage in the first bridge portions 30A and 30B, the second bridge portions 35A and 35B, and the third bridge portions 70A and 70B.

Stress is generated in each of the bridge portions 30A, 30B, 35A, 35B, 70A, and 70B during deflection of the first bridge portions 30A and 30B, the second bridge portions 35A and 35B, and the third bridge portions 70A and 70B. Generation of the stress leads to generation of a charge corresponding to the generated stress in a portion of the piezoelectric material layer 42 arranged above each of the bridge portions 30A, 30B, 35A, 35B, 70A, and 70B.

The power generating element 1 according to the present embodiment has a double-supported beam structure, in which the vibrating body 20 including the first weight body 25, the second weight bodies 26A and 26B, and the third bridge portions 70A and 70B is supported on the support frame 10 by the first bridge portions 30A and 30B and the second bridge portions 35A and 35B. This makes it possible to reduce the displacement of the first weight body 25 and the second weight bodies 26A and 26B in the vertical direction as described with reference to FIGS. 8 and 9. This makes it possible to avoid abutment of the first weight body 25 and the second weight bodies 26A and 26B against the top plate 16 and the bottom plate 17 of the casing 15 in a wider acceleration range. This enables suppressing an escape of the force received by the first weight body 25 and the second weight bodies 26A and 26B to the top plate 16 and the bottom plate 17, and increasing the stress generated in the bridge portions 30A, 30B, 35A, 35B, 70A, and 70B. As a result, the vibration energy applied to the first weight body 25 and the second weight bodies 26A and 26B can be efficiently converted into electric energy, achieving an increase in the charge generated from the piezoelectric element 40.

The charges generated in the upper electrode layers E11A to E34A of the piezoelectric element 40 are extracted as positive charges by the rectifying elements D11(+) to D34 (+) while extracted as negative charges by the rectifying elements D11(−) to D34(−). The extracted positive and negative charges are smoothed by the smoothing capacitive element Cf to be supplied to the load ZL.

The power generating element 1 according to the present embodiment also enables implementation of three-axis power generation similarly to the power generating element 1 according to the first embodiment. Since the vibrating body 20 is supported on the support frame 10 by the first bridge portions 30A and 30B and the second bridge portions 35A and 35B even when external vibration is applied in the X-axis direction and the Y-axis direction as described above, it is possible to reduce the displacement of the first weight body 25 and the second weight bodies 26A and 26B of the vibrating body 20.

Meanwhile, a power generating element that generates electric power by converting vibration energy into electric energy has a unique resonance frequency determined according to its structure. In a case where the frequency of external vibration is this resonance frequency or a value close to the resonance frequency, it is possible to achieve efficient vibration of the weight body. In a case, however, where the frequency of the external vibration is a value distant from the resonance frequency, there is a problem that it is difficult to achieve sufficient vibration of the vibrating body 20.

In contrast, since the vibrating body 20 of the power generating element 1 according to the present embodiment includes the first weight body 25 and the second weight bodies 26A and 26B, the power generating element 1 constitutes a combined vibration system including a resonance system I, a resonance system II, and a resonance system III. Among them, the resonance system I is a resonance system mainly defined on the basis of the first weight body 25 and the first bridge portions 30A and 30B, and has a unique resonance frequency I. The resonance system II is a resonance system mainly defined on the basis of the second weight body 26A and the second bridge portion 35A and has a unique resonance frequency II different from the resonance frequency I. The resonance system III is a resonance system mainly defined on the basis of the second weight body 26B and the second bridge portion 35B and has a unique resonance frequency III different from the resonance frequency I. In the case of setting the resonance frequency I to differ from the resonance frequencies II and III, for example, the mass of the first weight body 25 and the mass of the second weight bodies 26A and 26B may be set to different masses, or a spring constant (more specifically, the width, the thickness, the elastic modulus) of each of the first bridge portions 30A and 30B and of the second bridge portions 35A and 35B may be set to differ from each other. Alternatively, both the mass and the spring constant may be set different.

By constructing the combined vibration system including the resonance system I, the resonance system II, and the resonance system III as described above, it is possible to expand a power-generatable frequency band of vibration. In this case, by adjusting the inherent resonance frequency unique to each of the resonance systems, it is possible to expand or narrow the power-generatable frequency band.

In the present embodiment, the resonance frequency II is equal to the resonance frequency III. In other words, the mass of the second weight body 26A is equal to the mass of the second weight body 26B, while the spring constant of the second bridge portion 35A is equal to the spring constant of the second bridge portion 35B. Furthermore, the spring constant of the third bridge portion 70A is the same as the spring constant of the third bridge portion 70B. This makes it possible to allow the vibration of the vibrating body 20 when external vibration in the X-axis direction and/or the Z-axis direction is applied, to be plane-symmetrical with respect to the plane parallel to the Z-axis including the center axis LX. In this case, this makes it possible to equalize the total amount of positive charges and the total amount of negative charges generated in each of the upper electrode layers E11A to E34A and E11B to E34B, leading to enhancement of the power generation efficiency. The term "same" or "equal" is not limited to a strict sense and is used to indicate a concept including a range that can be regarded as substantially the same including manufacturing errors.

As described above, according to the present embodiment, the vibrating body 20 provided inside the support frame 10 includes the first weight body 25, the second weight bodies 26A and 26B, and the third bridge portions 70A and 70B coupling the first weight body 25 with the second weight bodies 26A and 26B, in which the first weight body 25 is supported on the first frame portion 11 of the support frame 10 by the first bridge portions 30A and 30B, while the second weight bodies 26A and 26B are supported on the second frame portion 12 of the support frame 10 by the second bridge portions 35A and 35B. This makes it possible to suppress the amount of displacement of the first weight body 25 and the second weight bodies 26A and 26B in a case where external vibration is applied, and avoid abutment of the first weight body 25 and the second weight bodies 26A and 26B against the top plate 16 and the bottom plate 17 of the casing 15 in a wider acceleration range. With this configuration, it is possible to suppress an escape of the force received by the first weight body 25 and the second weight bodies 26A and 26B, to the top plate 16 and the bottom plate 17, and increase the stress generated in the first bridge portions 30A and 30B and the second bridge portions 35A and 35B, leading to an increase in the charge generated from the piezoelectric element 40. As a result, it is possible to suppress the displacement of the first weight body 25 and the second weight bodies 26A and 26B and increase the power generation amount.

Moreover, according to the present embodiment, the vibrating body 20 includes the first weight body 25, the second weight bodies 26A and 26B, and the third bridge portions 70A and 70B coupling the first weight body 25 with the second weight bodies 26A and 26B. With this configuration, it is possible to achieve the power generating element 1 of a combined vibration system including the resonance system I defined on the basis of the first weight body 25 and the first bridge portions 30A and 30B, the resonance system II defined on the basis of the second weight body 26A and the second bridge portion 35A, and the resonance system III defined on the basis of the second weight body 26B and the second bridge portion 35B. This makes it possible to expand the power-generatable frequency band of vibration to perform efficient power generation in various usage environments.

Moreover, according to the present embodiment, the second bridge portions 35A and 35B are arranged on both sides of the first bridge portions 30A and 30B in the Y-axis direction, respectively, and the third bridge portions 70A and 70B are arranged between the first bridge portions 30A and 30B and the second bridge portions 35A and 35B, respectively. This makes it possible to equalize the total amount of the positive charges and the total amount of the negative charges generated in the upper electrode layers E11A to E34A and E11B to E34B, leading to enhancement of the power generation efficiency. In particular, by arranging the first bridge portions 30A and 30B, the second bridge portions 35A and 35B, and the vibrating body 20 to be plane-symmetrical with respect to the plane parallel to the Z-axis including the center axis LX extending in the X-axis direction of the first weight body 25, the total amount of positive charges and the total amount of negative charges can be further equalized so as to further enhance power generation efficiency.

Moreover, according to the present embodiment, the first bridge portions 30A and 30B, the second bridge portions 35A and 35B, and the third bridge portions 70A and 70B extend along each other, respectively. This makes it possible to increase the space efficiency of the bridge portions 30A, 30B, 35A, 35B, 70A, and 70B and to miniaturize the power generating element 1.

The above-described embodiment is an exemplary case where the four upper electrode layers E11A to E34A and E11B to E34B are provided above the first bridge portions 30A and 30B, above the second bridge portions 35A and 35B, and above the third bridge portions 70A and 70B, respectively. This is not a limitation, however, and the number, arrangement, etc. of the upper electrode layers are optional. For example, as illustrated in FIG. 1 described above, it is allowable to configure such that two upper electrode layers are provided above each of the bridge portions 30A, 30B, 35A, 35B, 70A, and 70B, and the two upper electrode layers are arranged at mutually different positions in the X-axis direction. FIG. 17 is a plan view of another example of the upper electrode of the piezoelectric element illustrated in FIG. 10. As illustrated in FIG. 17, as long as it is possible to avoid the charge being canceled by simultaneously receiving the compressive stress and the tensile stress, it is allowable to arrange two upper electrode layers E11' and E12' above the bridge portions 30A, 30B, 35A, 35B, 70A, and 70B and arrange the upper electrode layers E11' and E12' at mutually different positions in the Y-axis direction. FIG. 18 is a plan view of another example of the upper electrode of the piezoelectric element illustrated in FIG. 10. As illustrated in FIG. 18, as long as it is possible to avoid the charge being canceled by simultaneously receiving the compressive stress and the tensile stress, it is allowable to arrange one upper electrode layer E1 above each of the bridge portions 30A, 30B, 35A, 35B, 70A, and 70B. Moreover, it is allowable to make a difference between the number and arrangement of the upper electrode layers arranged above the first bridge portions 30A and 30B, the number and arrangement of the upper electrode layers arranged above the second bridge portions 35A and 35B, and the number and arrangement of the upper electrode layers arranged above the third bridge portions 70A and 70B.

The above-described present embodiment is an exemplary case where the second weight bodies 26A and 26B and the second bridge portions 35A and 35B are arranged on both sides of the two first bridge portions 30A and 30B in the Y-axis direction in plan view. The present invention is not limited to this, however, and it is allowable to arrange one second weight body and one second bridge portion on one side of the first bridge portions 30A and 30B, and arrange no second weight body and no second bridge portion on the other side. In this case, it is also possible to increase the stress generated in the first bridge portions 30A and 30B and the second bridge portion to increase the charge generated from the piezoelectric element 40, and expand the power-generatable frequency band of vibration, While this is an example in which the vibrating body 20 is supported by the two first bridge portions 30A and 30B, the number of the first bridge portions supporting the vibrating body 20 may be one. That is, the first bridge portion 30A and the first bridge portion 30B may be integrally formed.

Moreover, the above-described embodiment is an example in which the first bridge portions 30A and 30B, the second bridge portions 35A and 35B, and the third bridge portions 70A and 70B are mutually parallel. However, the first bridge portions 30A and 30B, the second bridge portions 35A and 35B, and the third bridge portions 70A and 70B are not limited to being mutually parallel unless they cross each other.

Third Embodiment

Next, a power generating element according to a third embodiment of the present invention will be described with reference to FIGS. 19 to 22.

In the third embodiment illustrated in FIGS. 19 to 22, main differences are in that the first weight body includes a first additional weight body and the second weight body includes a second additional weight body. The other configurations are substantially the same as those of the second embodiment illustrated in FIGS. 10 to 18. In FIGS. 19 to 22, the same portions as those of the second embodiment illustrated in FIGS. 10 to 18 will be denoted by the same reference numerals, and a detailed description thereof will be omitted.

Figure 19:
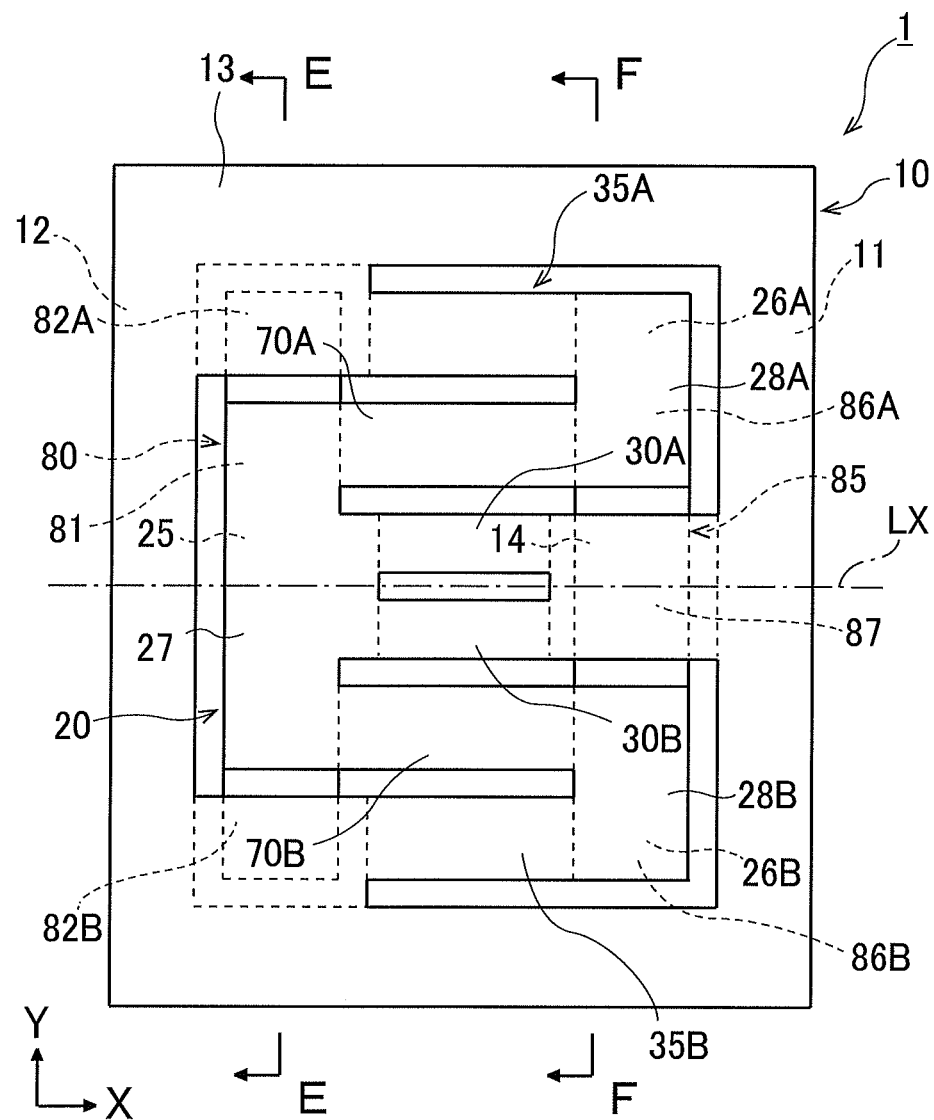
FIG. 19 is a top view illustrating an overall configuration of a power generating element according to a third embodiment of the present invention.
Figure 20:
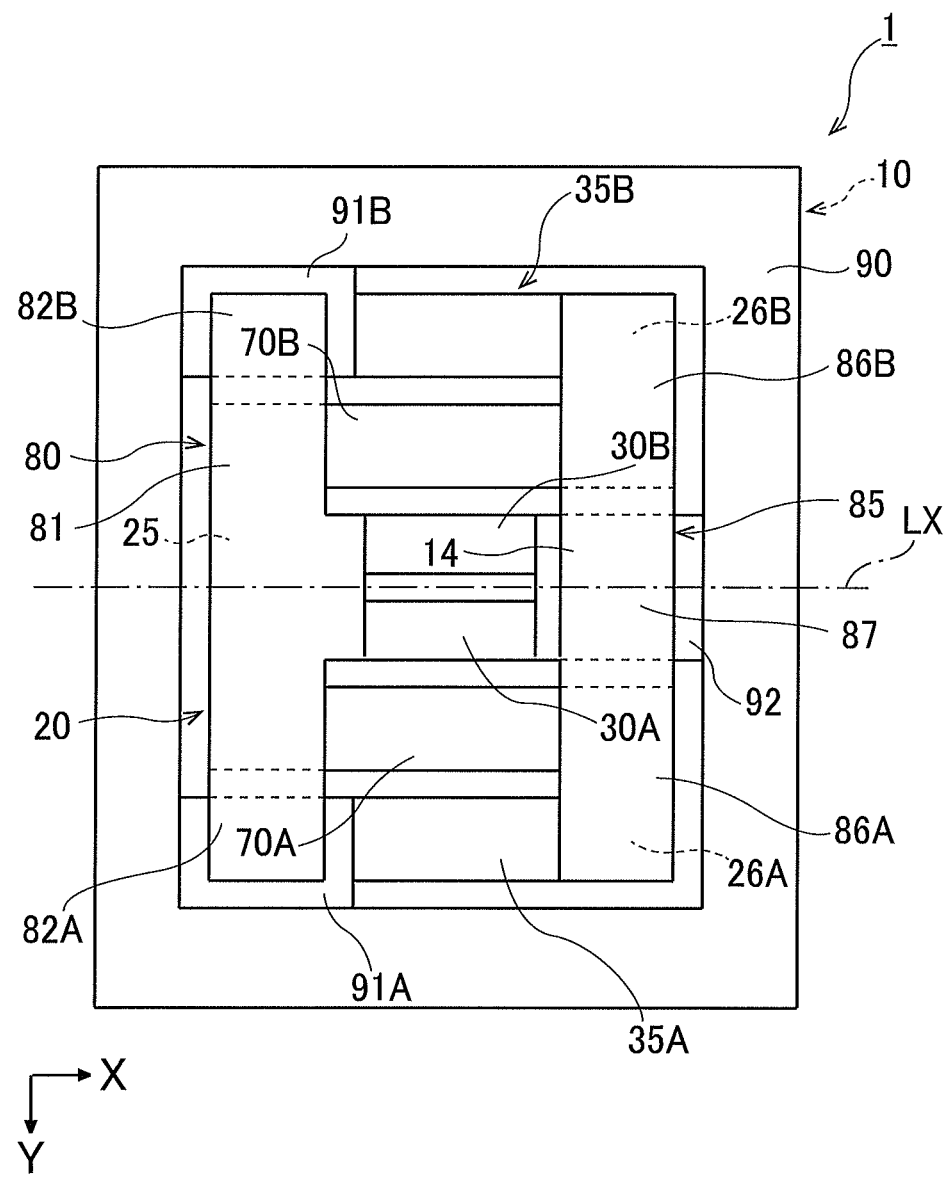
FIG. 20 is a bottom view of the power generating element illustrated in FIG. 19.
Figure 21:
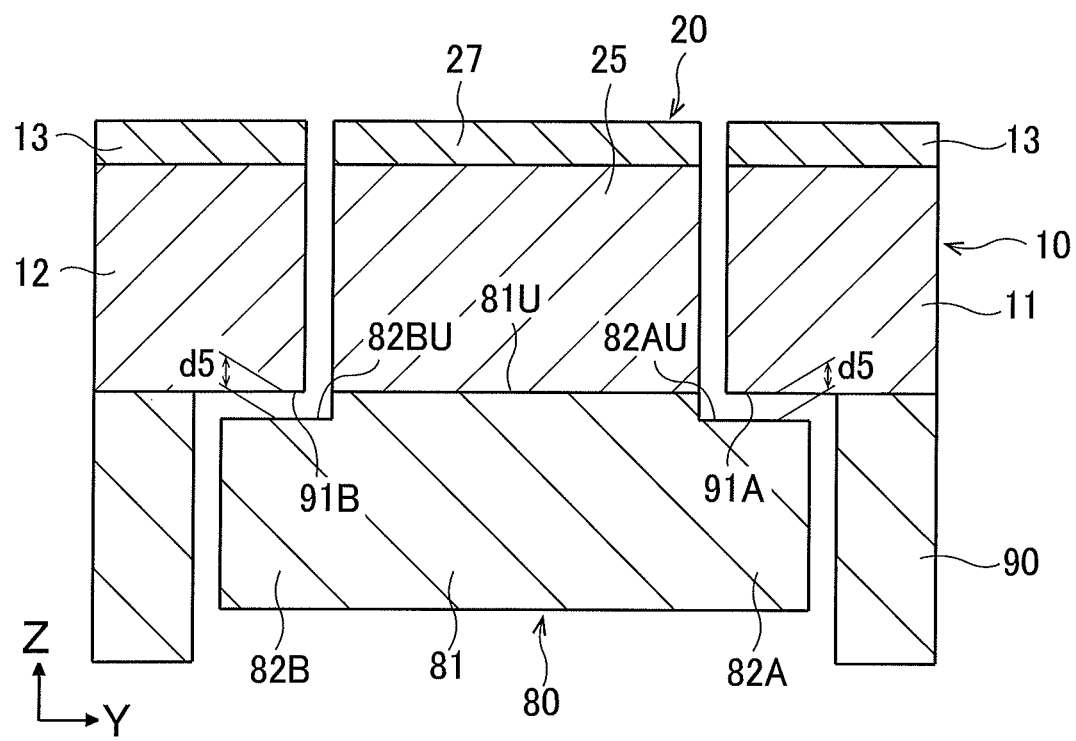
FIG. 21 is a cross-sectional view taken along line E-E of FIG. 19.
Figure 22:
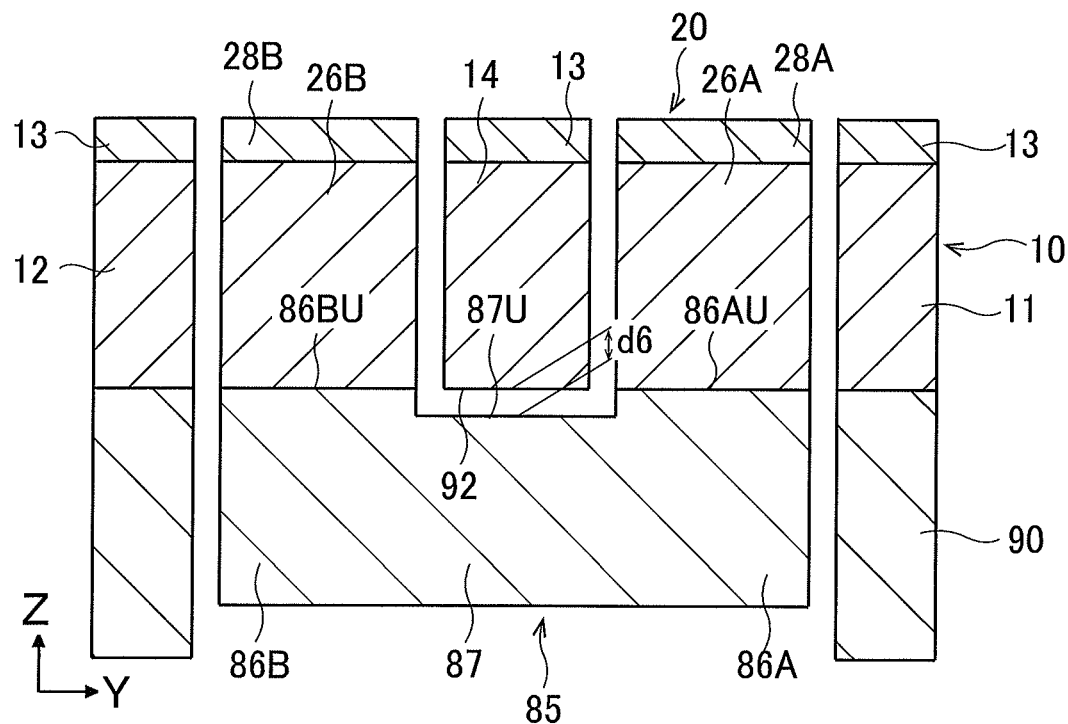
FIG. 22 is a cross-sectional view taken along line F-F of FIG. 19.

FIG. 19 illustrates a top view of an overall configuration of the power generating element according to the third embodiment of the present invention. FIG. 20 illustrates a bottom view of the power generating element of FIG. 19. FIG. 21 illustrates a cross-sectional view taken along line E-E of FIG. 19. FIG. 22 illustrates a cross-sectional view taken along line F-F of FIG. 19. In the present embodiment, as illustrated in FIGS. 19 to 21, a first additional weight body 80 is provided on a lower surface of the first weight body 25 (opposite side of the first weight body supporting portion 27 side). This configuration allows the first weight body 25 and the first additional weight body 80 to be coupled to the X-axis negative side ends 32A and 32B (refer to FIG. 10) of the first bridge portions 30A and 30B, increasing the mass of the weight body coupled to the first bridge portions 30A and 30B. Moreover, a combined center of gravity of the first weight body 25 and the first additional weight body 80 (position of the center of gravity of the weight body formed by the first weight body 25 and the first additional weight body 80) is at a position lower than the center of gravity of the first weight body 25 in a case where the first additional weight body 80 is not provided (refer to FIGS. 10 to 13).

Similarly, as illustrated in FIGS. 19, 20 and 22, a second additional weight body 85 is provided on a lower surface of the second weight bodies 26A and 26B (opposite side of the second weight body supporting portions 28A and 28B side). This configuration allows the second weight bodies 26A and 26B and the second additional weight body 85 to be coupled to the X-axis positive side ends 36A and 36B (refer to FIG. 10) of the second bridge portions 35A and 35B, increasing the mass of the weight body coupled to the second bridge portions 35A and 35B. Moreover, a combined center of gravity of the second weight bodies 26A and 26B and the second additional weight body 85 (position of the center of gravity of the weight body formed by the second weight bodies 26A and 26B and the second additional weight body 85) is at a position lower than the center of gravity of the second weight bodies 26A and 26B in a case where the second additional weight body 85 is not provided (refer to FIGS. 10 to 13). The second additional weight body 85 extends from one second weight body 26A to the other second weight body 26B and is attached to and supported by both of the second weight bodies 26A and 26B. As a result, the second additional weight body 85 is formed so as to stride the lower side of the protrusion 14 of the support frame 10.

As illustrated in FIGS. 19 to 21, the first additional weight body 80 includes first stopper portions 82A and 82B provided so as to be able to abut the support frame 10. The first stopper portions 82A and 82B are configured to regulate displacement of the first weight body 25 to the upper side (the first weight body supporting portion 27 side, positive side on the Z-axis). That is, the first additional weight body 80 is formed so as to extend more toward the positive side on the Y-axis and the negative side on the Y-axis than the first weight body 25 in plan view. The first stopper portions 82A and 82B are arranged at both ends of the first additional weight body 80 in the Y-axis direction (direction orthogonal to the X-axis direction from the first weight body 25 toward the first frame portion 11). More specifically, the first additional weight body 80 includes a first main body portion 81 overlapping with the first weight body 25 in plan view, a first stopper portion 82A arranged more toward the positive side on the Y-axis than the first main body portion 81, and a first stopper portion 82B arranged more toward the negative side on the Y-axis than the first main body portion 81. Among them, the first stopper portion 82A protrudes from the first weight body 25 toward the positive side on the Y-axis, while the first stopper portion 82B protrudes from the first weight body 25 toward the negative side on the Y-axis.

An additional support frame 90 is provided on the lower surface of the support frame 10. The additional support frame 90 is formed in a rectangular frame shape in plan view such that the first additional weight body 80 is arranged inside the additional support frame 90. The lower surface of the first additional weight body 80 is positioned above the lower surface of the additional support frame 90. The first weight body 25 and the first additional weight body 80 can be displaced downward until they abut the bottom plate 17 of the casing 15 described above. Moreover, the lower surface of the support frame 10 includes first seats 91A and 91B to which the first stopper portions 82A and 82B abut. The first seats 91A and 91B are formed on a portion of the X-axis negative side ends 37A and 37B (refer to FIG. 10) side of the second bridge portions 35A and 35B in the support frame 10 in plan view. The inner surface of the additional support frame 90 is partially retreated more outwardly than the inner surface of the support frame 10 so as to expose the first seats 91A and 91B downward. In this manner, the additional support frame 90 is formed so as to avoid interference with the first stopper portions 82A and 82B of the first additional weight body 80, to enable the first stopper portions 82A and 82B to abut the first seats 91A and 91B, respectively.

As illustrated in FIG. 21, upper surfaces 82AU and 82BU of the first stopper portions 82A and 82B are positioned below an upper surface 81U of the first main body portion 81. For example, when manufacturing the first additional weight body 80, it is possible to form the upper surfaces 82AU and 82BU of the first stopper portions 82A and 82B by partially removing the upper surface of the first additional weight body 80 by etching, machining, or the like. In this manner, when the first weight body 25 is in the neutral position, the first stopper portions 82A and 82B are spaced apart from the first seats 91A and 91B of the support frame 10, respectively, by a predetermined distance d5. With this configuration, the first weight body 25 can be displaced upward until the first stopper portions 82A and 82B abut the first seats 91A and 91B, respectively. This distance d5 may be equal to the distance d3 illustrated in FIG. 16 or may be shorter than the distance d3. With this configuration, the first stopper portions 82A and 82B can function as stoppers for upward displacement of the first weight body 25.

The second additional weight body 85 includes a second stopper portion 87 provided so as to be able to abut the support frame 10. The second stopper portion 87 is configured to regulate displacement of the second weight bodies 26A and 26B to the upper side (second weight body supporting portions 28A and 28B side). That is, the second additional weight body 85 includes a second main body portion 86A arranged below one second weight body 26A, a second main body portion 86B arranged below the other second weight body 26B, and a second stopper portion 87 arranged between the two second main body portions 86A and 86B. Among them, the second stopper portion 87 is arranged below the protrusion 14 of the support frame 10. The second main body portions 86A and 86B and the second stopper portion 87 are integrally formed and the second additional weight body 85 is formed so as to generally stride the lower side of the protrusion 14 of the support frame 10.

The above-described additional support frame 90 is formed such that the second additional weight body 85 is arranged inside the additional support frame 90. The lower surface of the second additional weight body 85 is positioned above the lower surface of the additional support frame 90. The second weight bodies 26A and 26B and the second additional weight body 85 can be displaced downward until they abut the bottom plate 17 of the casing 15 described above. The lower surface of the support frame 10 includes a second seat 92 to which the second stopper portion 87 abuts. That is, the protrusion 14 of the support frame 10 described above includes the second seat 92 formed on the lower surface. The inner surface of the additional support frame 90 is retreated more outwardly than the protrusion 14 so as to expose the second seat 92 downward. In this manner, the additional support frame 90 is formed so as to avoid interference with the second stopper portion 87 of the second additional weight body 85, to enable the second stopper portion 87 to abut the second seat 92.

As illustrated in FIG. 22, the upper surface 87U of the second stopper portion 87 is positioned below upper surfaces 86AU and 86BU of the second main body portions 86A and 86B. For example, when manufacturing the second additional weight body 85, it is possible to form the second stopper portion 87 by partially removing the upper surface of the second additional weight body 85 by etching, machining, or the like. In this manner, when the second weight bodies 26A and 26B are in the neutral positions, the second stopper portion 87 is spaced apart from the second seat 92 of the support frame 10 by a predetermined distance d6. With this configuration, the second weight bodies 26A and 26B can be displaced upward until the second stopper portion 87 abuts the second seat 92. This distance d6 may be equal to the distance d3 illustrated in FIG. 16 or may be shorter than the distance d3. With this configuration, the second stopper portion 87 can function as stoppers for upward displacement of the second weight bodies 26A and 26B.

The first additional weight body 80 may be fabricated separately from the first weight body 25 by a same material (silicon) as the first weight body 25. In this case, the first additional weight body 80 may be joined to the lower surface of the first weight body 25 using a direct joining technique. Alternatively, the first additional weight body 80 may be fabricated with glass or metal. In this case, the first additional weight body 80 may be joined to the lower surface of the first weight body 25 fabricated with silicon using anodic bonding technology. Similarly, the second additional weight body 85 and the additional support frame 90 can be joined to the lower surfaces of the second weight bodies 26A and 26B and the lower surface of the support frame 10, respectively. It is preferable that the lower surfaces of the first weight body 25 and the second weight bodies 26A and 26B are flush with the lower surface of the support frame 10.

The power generating element 1 according to the present embodiment constitutes a combined vibration system including a resonance system IV and a resonance system V. Among them, the resonance system IV is a resonance system mainly defined on the basis of the first weight body 25, the first additional weight body 80, and the first bridge portions 30A and 30B, and has a unique resonance frequency IV. The resonance system V is a resonance system mainly defined on the basis of the second weight bodies 26A and 26B, the second additional weight body 85, and the second bridge portions 35A and 35B, and has a unique resonance frequency V. The resonance frequency IV and the resonance frequency V are different from each other. In setting the resonance frequency IV to differ from the resonance frequency V, for example, the total mass of the first weight body 25 and the first additional weight body 80 may be set to be different from the total mass of the second weight bodies 26A and 26B and the second additional weight body 85, or a spring constant (more specifically, the width, the thickness, the elastic modulus) of the first bridge portions 30A and 30B may be set to be different from the spring constant of the second bridge portions 35A and 35B, or alternatively, both the mass and the spring constant may be set mutually different.

By constructing the combined vibration system including the resonance system IV and the resonance system V as described above, it is possible to expand a power-generatable frequency band of vibration. In this case, by adjusting the resonance frequency unique to each of the resonance systems, it is possible to expand or narrow the power-generatable frequency band.

In this manner, according to the present embodiment, the first additional weight body 80 is provided on the lower surface of the first weight body 25. This configuration makes it possible to achieve a lower combined center of gravity of the first weight body 25 and the first additional weight body 80 compared with the center of gravity of the first weight body 25 in a case where the first additional weight body 80 is not provided. This makes it possible to increase the stress generated in each of the bridge portions 30A, 30B, 35A, 35B, 70A, and 70B in a case where the external vibration is applied in each of the X-axis direction and the Y-axis direction. Moreover, it is possible to increase the mass of the weight body (the first weight body 25 and the first additional weight body 80) coupled to the first bridge portions 30A and 30B, achieving an increase in the stress generated in each of the bridge portions 30A, 30B, 35A, 35B, 70A, and 70B in a case where the external vibration is applied in each of the X-axis direction, the Y-axis direction, and the Z-axis direction. As a result, it is possible to increase the charge generated from the piezoelectric element 40, leading to enhancement of the power generation efficiency of three-axis power generation.

Moreover, according to the present embodiment, the second additional weight body 85 is provided on the lower surface of the second weight bodies 26A and 26B. With this configuration, a combined center of gravity of the second weight bodies 26A and 26B and the second additional weight body 85 (position of the center of gravity of the entire weight body formed by the second weight bodies 26A and 26B and the second additional weight body 85) can be set to a position lower than the center of gravity of the second weight bodies 26A and 26B in a case where the second additional weight body 85 is not provided. This makes it possible to increase the stress generated in each of the bridge portions 30A, 30B, 35A, 35B, 70A, and 70B in a case where the external vibration is applied in each of the X-axis direction and the Y-axis direction. Moreover, it is possible to increase the mass of the weight body (the second weight bodies 26A and 26B and the second additional weight body 85) coupled to the second bridge portions 35A and 35B, achieving an increase in the stress generated in each of the bridge portions 30A, 30B, 35A, 35B, 70A, and 70B in a case where the external vibration is applied in each of the X-axis direction, the Y-axis direction, and the Z-axis direction. As a result, it is possible to increase the charge generated from the piezoelectric element 40, leading to enhancement of the power generation efficiency of three-axis power generation.

Moreover, according to the present embodiment, the second additional weight body 85 extends from one second weight body 26A to the other second weight body 26B and is attached to and supported by both of the second weight bodies 26A and 26B. This allows the second additional weight body 85 to have a larger planar area than the sum of the planar areas of the second weight body 26A and the second weight body 26B. This makes it possible to increase the mass of the second additional weight body 85 and to enhance the power generation efficiency.

Moreover, according to the present embodiment, the first additional weight body 80 includes the first stopper portions 82A and 82B provided so as to be able to abut the first seats 91A and 91B of the support frame 10. This makes it possible to regulate the upward displacement of the first weight body 25 even in a case where external vibration in any of the X-axis direction, the Y-axis direction, and the Z-axis direction is applied. Therefore, plastic deformation and breakage in the first bridge portions 30A and 30B, the second bridge portions 35A and 35B, and the third bridge portions 70A and 70B can be further prevented, leading to enhancement of the reliability of the power generating element 1.

Moreover, according to the present embodiment, the first stopper portions 82A and 82B can be arranged at both ends of the first additional weight body 80 in the Y-axis direction. This makes it possible to stabilize the posture of the first additional weight body 80 when the first stopper portions 82A and 82B abut the first seats 91A and 91B. This configuration makes it possible to regulate the upward displacement of the first weight body 25 further reliably. Moreover, in a case where external vibration in the Y-axis direction is applied, the first weight body 25 and the first additional weight body 80 swing in the YZ plane, and thus, even in a case where the first weight body 25 and the first additional weight body 80 swing in any direction, the first stopper portion 82A can abut the first seat 91A, or the first stopper portion 82B can abut the first seat 91B.

Moreover, according to the present embodiment, the second additional weight body 85 includes the second stopper portion 87 provided so as to be able to abut the second seat 92 of the support frame 10. This makes it possible to regulate the upward displacement of the second weight bodies 26A and 26B even in a case where external vibration in any of the X-axis direction, the Y-axis direction, and the Z-axis direction is applied. Therefore, plastic deformation and breakage in the first bridge portions 30A and 30B, the second bridge portions 35A and 35B, and the third bridge portions 70A and 70B can be further prevented, leading to enhancement of the reliability of the power generating element 1.

Moreover, according to the present embodiment, the second stopper portion 87 of the second additional weight body 85 abuts the second seat 92 provided in the protrusion 14 interposed between the first frame portion 11 of the support frame 10 and the first bridge portions 30A and 30B. This makes it possible to stabilize the posture of the second additional weight body 85 when the second stopper portion 87 abuts the second seat 92. This configuration makes it possible to regulate the upward displacement of the second weight bodies 26A and 26B further reliably.

The above-described present embodiment is a case where the second additional weight body 85 extends from the one second weight body 26A to the other second weight body 26B straddling the lower side of the protrusion 14 of the support frame 10 and is attached to and supported by both of the second weight bodies 26A and 26B. However, the present invention is not limited to this example, and a second additional weight body provided on the lower surface of the second weight body 26A and a second additional weight body provided on the lower surface of the second weight body 26B may be separately formed and spaced apart from each other. Also in this case, it is possible to lower the combined center of gravity of the second weight bodies 26A and 26B and the corresponding second additional weight body.

The above-described present embodiment is an exemplary case where the second weight bodies 26A and 26B and the second bridge portions 35A and 35B are arranged on both sides of the two first bridge portions 30A and 30B in the Y-axis direction in plan view. The present invention is not limited to this, however, and it is allowable to arrange one second weight body and one second bridge portion on one side of the first bridge portions 30A and 30B, and arrange no second weight body and no second bridge portion on the other side. In this case, by providing the second additional weight body on the lower surface of the one second weight body, it is possible to lower the combined center of gravity of the second weight body and the second additional weight body.

Fourth Embodiment

Next, a power generating element according to a fourth embodiment of the present invention will be described with reference to FIGS. 23 to 26.

In the fourth embodiment illustrated in FIGS. 23 to 26, a main difference is in that the second additional weight body includes a third stopper portion capable of abutting the support frame. The other configurations are substantially the same as those of the third embodiment illustrated in FIGS. 19 to 22. In FIGS. 23 to 26, the same portions as those of the third embodiment illustrated in FIGS. 19 to 22 will be denoted by the same reference numerals, and a detailed description thereof will be omitted.

Figure 23:
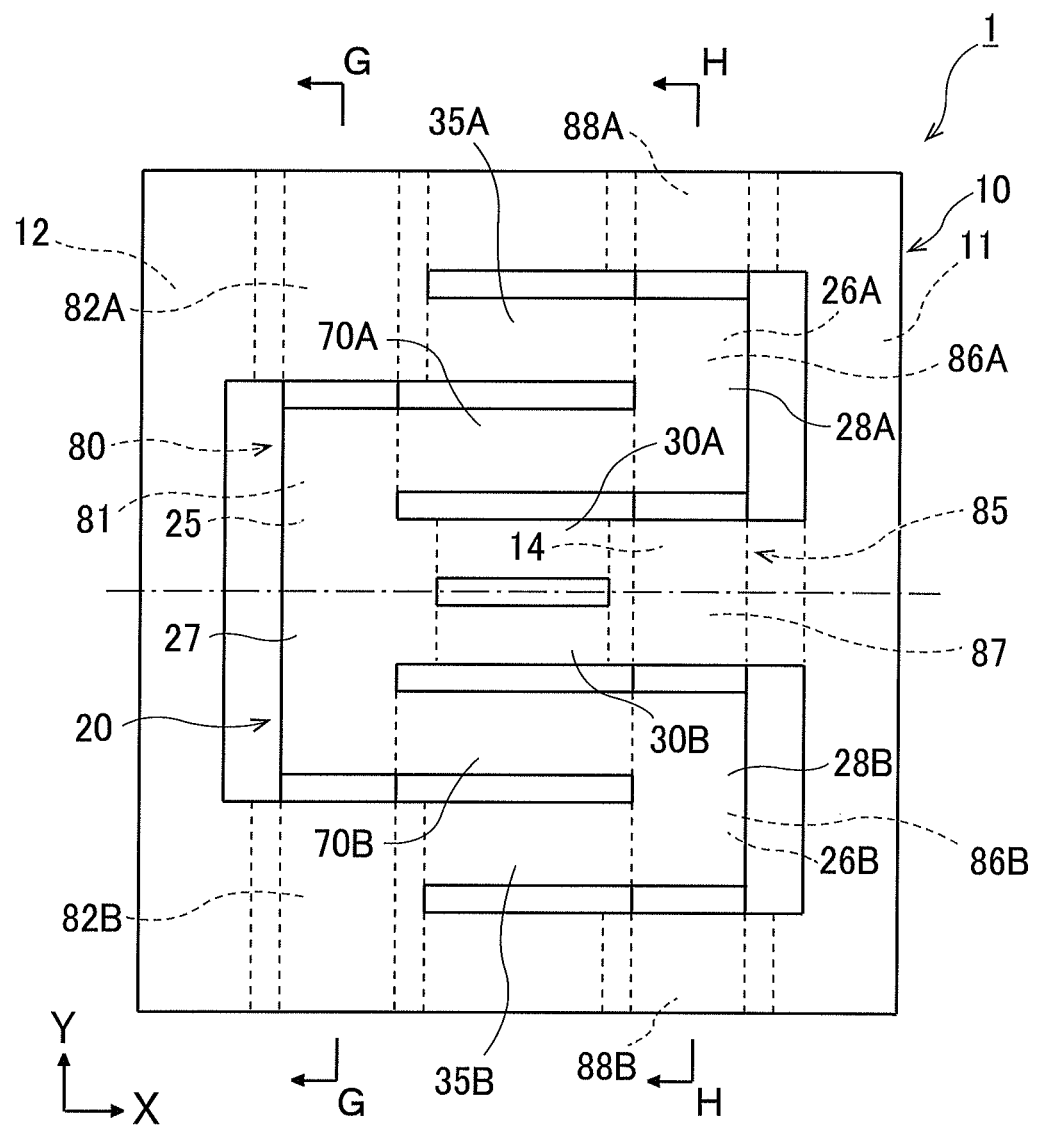
FIG. 23 is a top view illustrating an overall configuration of a power generating element according to a fourth embodiment of the present invention.
Figure 24:
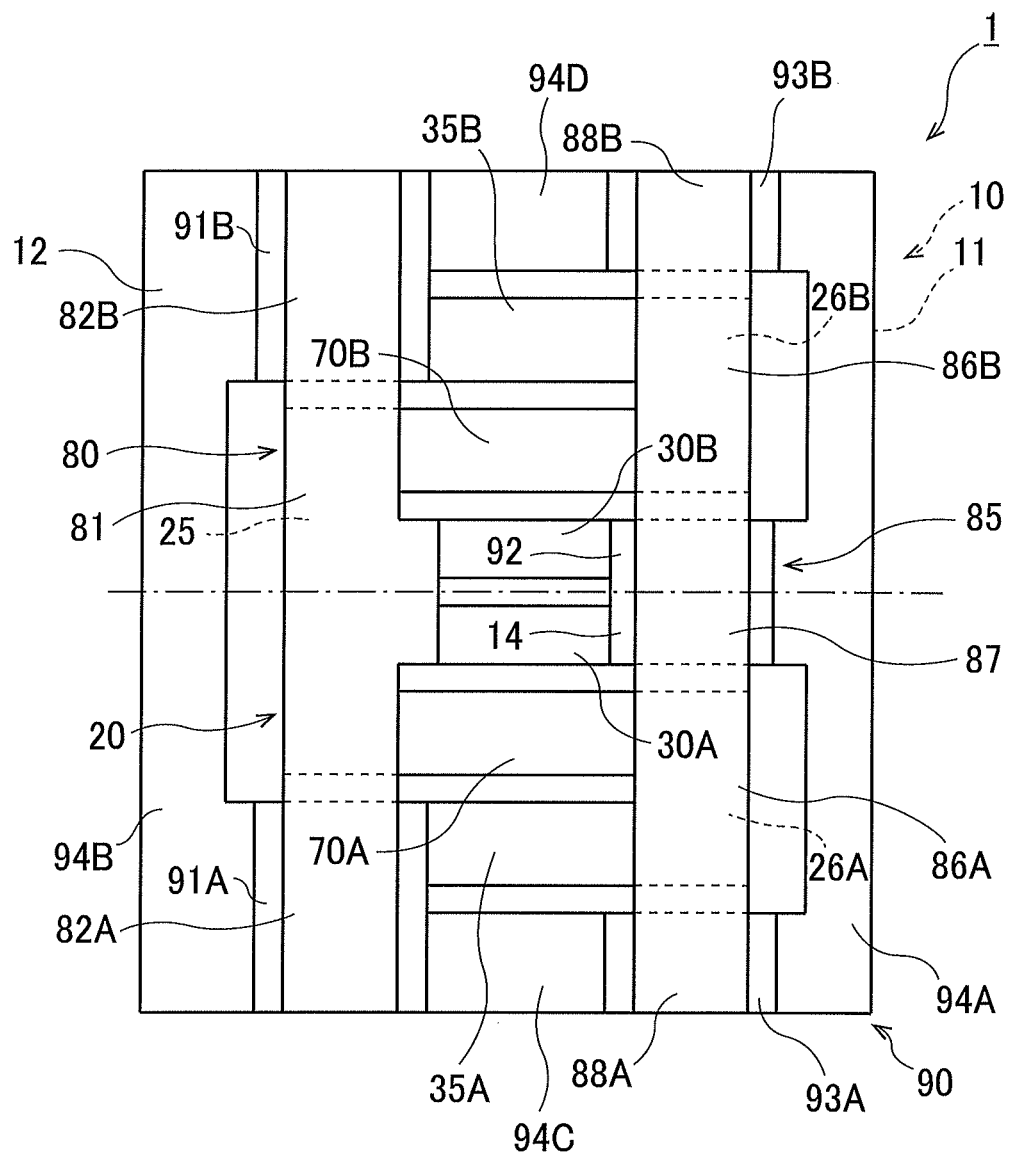
FIG. 24 is a bottom view of the power generating element illustrated in FIG. 23.
Figure 25:
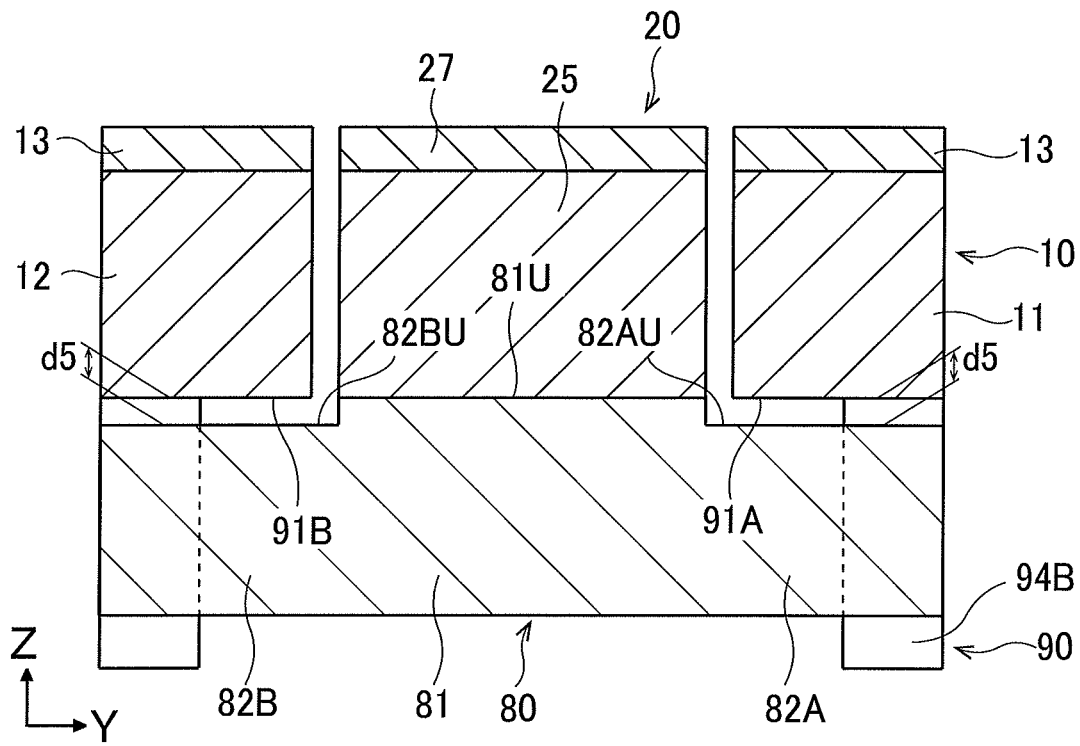
FIG. 25 is a cross-sectional view of the power generating element illustrated in FIG. 23, taken along line G-G.
Figure 26:
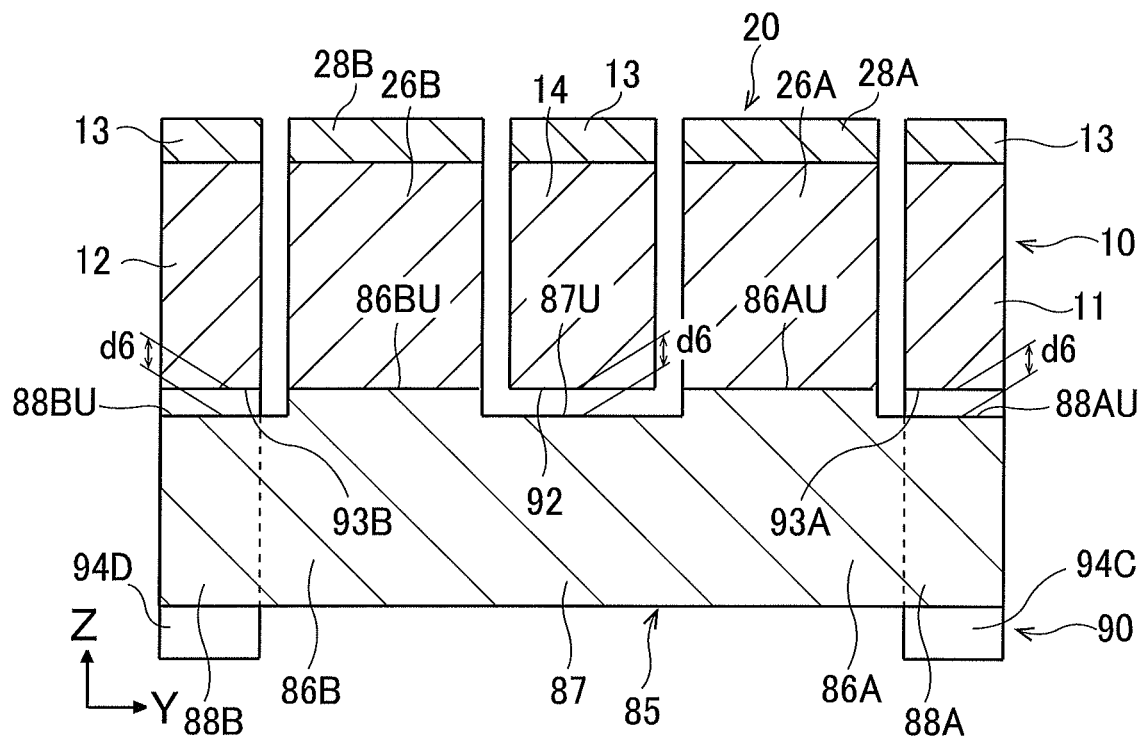
FIG. 26 is a cross-sectional view of the power generating element illustrated in FIG. 23, taken along line H-H.

FIG. 23 illustrates a top view of an overall configuration of the power generating element according to the fourth embodiment of the present invention. FIG. 24 illustrates a bottom view of the power generating element of FIG. 23. FIG. 25 illustrates a cross-sectional view taken along line G-G of FIG. 23. FIG. 26 illustrates a cross-sectional view taken along line H-H of FIG. 23. In the present embodiment, as illustrated in FIGS. 23, 24 and 26, the second additional weight body 85 further includes third stopper portions 88A and 88B provided so as to be able to abut the support frame 10. The third stopper portions 88A and 88B are configured to regulate displacement of the second weight bodies 26A and 26B to the upper side (second weight body supporting portions 28A and 28B sides). That is, the second additional weight body 85 is formed so as to extend more toward the positive side on the Y-axis and the negative side on the Y-axis than the second weight bodies 26A and 26B in plan view. The third stopper portions 88A and 88B are arranged at both ends of the second additional weight body 85 in the Y-axis direction (direction orthogonal to the X-axis direction from the second weight bodies 26A and 26B toward the second frame portion 12). More specifically, the second additional weight body 85 further includes a third stopper portion 88A arranged more toward the positive side on the Y-axis than the second main body portion 86A, and a third stopper portion 88B arranged more toward the negative side on the Y-axis than the other second main body portion 86B. Among them, the third stopper portion 88A protrudes from the second weight bodies 26A and 26B toward the positive side on the Y-axis, while the third stopper portion 88B protrudes from the second weight bodies 26A and 26B toward the negative side on the Y-axis.

The lower surface of the support frame 10 includes third seats 93A and 93B to which the third stopper portions 88A and 88B abut, respectively. The third seats 93A and 93B are formed in the vicinity of the X-axis positive side ends 36A and 36B (refer to FIG. 10) of the second bridge portions 35A and 35B in the support frame 10, respectively in plan view. The additional support frame 90 is formed so as to expose the third seats 93A and 93B downward. In this manner, the additional support frame 90 is formed so as to avoid interference with the third stopper portions 88A and 88B of the second additional weight body 85, to enable the third stopper portions 88A and 88B to abut the third seats 93A and 93B.

As illustrated in FIG. 26, upper surfaces 88AU and 88BU of the third stopper portions 88A and 88B are positioned lower than the upper surfaces 86AU and 86BU of the second main body portions 86A and 86B, and are formed at the same height position with the upper surface 87U of the second stopper portion 87. The third stopper portions 88A and 88B can be formed similarly to the above-described second stopper portion 87. In this manner, when the second weight bodies 26A and 26B are in the neutral positions, the third stopper portions 88A and 88B are spaced apart from the third seats 93A and 93B of the support frame 10 by a predetermined distance d6. With this configuration, the second weight bodies 26A and 26B can be displaced upward until the third stopper portions 88A and 88B abut the third seats 93A and 93B, respectively.

As illustrated in FIGS. 23 and 24, the first stopper portions 82A and 82B of the first additional weight body 80 may extend to an outer edge (an outer surface in FIG. 23) of the support frame 10 in plan view. Similarly, the third stopper portions 88A and 88B of the second additional weight body 85 may extend to the outer edge (the outer surface in FIG. 23) of the support frame 10 in plan view. In this case, the additional support frame 90 is divided into four support frame segments 94A to 94D. The first seats 91A and 91B and the third seats 93A and 93B of the support frame 10 are exposed downward between the adjacent support frame segments 94A to 94D.

In this manner, according to the present embodiment, the first stopper portions 82A and 82B of the first additional weight body 80 extend to the outer edge of the support frame 10 in plan view. This enables the contact region between the first stopper portions 82A and 82B and the first seats 91A and 91B of the support frame 10 to be expanded respectively, making it possible to stabilize the posture of the first additional weight body 80 when the first stopper portions 82A and 82B abut the first seats 91A and 91B. This makes it possible to regulate the upward displacement of the first weight body 25 further reliably even in a case where external vibration in any of the X-axis direction, the Y-axis direction, and the Z-axis direction is applied. Moreover, it is possible to increase the mass of the first additional weight body 80, making it possible to increase the stress generated in each of the bridge portions 30A, 30B, 35A, 35B, 70A, and 70B in a case where the external vibration is applied in each of the X-axis direction, the Y-axis direction, and the Z-axis direction.

Moreover, according to the present embodiment, the second additional weight body 85 provided on the lower surface of the second weight bodies 26A and 26B includes the third stopper portions 88A and 88B respectively provided so as to be able to abut the third seats 93A and 93B of the support frame 10. This makes it possible to regulate the upward displacement of the second weight bodies 26A and 26B even in a case where external vibration in any of the X-axis direction, the Y-axis direction, and the Z-axis direction is applied. Therefore, plastic deformation and breakage in the first bridge portions 30A and 30B, the second bridge portions 35A and 35B, and the third bridge portions 70A and 70B can be further prevented, leading to enhancement of the reliability of the power generating element 1.

Moreover, according to the present embodiment, the third stopper portions 88A and 88B can be arranged at both ends of the second additional weight body 85 in the Y-axis direction. This makes it possible to stabilize the posture of the second additional weight body 85 when the third stopper portions 88A and 88B abut the third seats 93A and 93B, respectively. This configuration makes it possible to regulate the upward displacement of the second weight bodies 26A and 26B further reliably. Moreover, in a case where external vibration in the Y-axis direction is applied, the first weight body 25 and the first additional weight body 80 swing in the YZ plane, and thus, even in a case where the first weight body 25 and the first additional weight body 80 swing in any direction, the first stopper portion 82A can abut the first seat 91A, or the first stopper portion 82B can abut the first seat 91B.

Moreover, according to the present embodiment, the third stopper portions 88A and 88B of the second additional weight body 85 extend to the outer edge of the support frame 10 in plan view. This can increase the contact region between the third stopper portions 88A and 88B and the third seats 93A and 93B of the support frame 10, making it possible to stabilize the posture of the second additional weight body 85 when the third stopper portions 88A and 88B abut the third seats 93A and 93B, respectively. This configuration makes it possible to regulate the upward displacement of the second weight bodies 26A and 26B further reliably. Moreover, it is possible to increase the mass of the second additional weight body 85, making it possible to increase the stress generated in each of the bridge portions 30A, 30B, 35A, 35B, 70A, and 70B in a case where the external vibration is applied in each of the X-axis direction, the Y-axis direction, and the Z-axis direction.

The present invention is not limited to the above-described embodiments and modifications as they are, and constituent elements can be modified and embodied within the scope not deviating from the spirit thereof at a stage of implementation. Moreover, various inventions can be formed by appropriately combining a plurality of constituent elements disclosed in the embodiment and the modifications. Some constituent elements may be deleted from all the constituent elements illustrated in the embodiments and the modifications. Moreover, constituent elements according to different embodiments and modifications may be appropriately combined with each other.

Example

Figure 27:
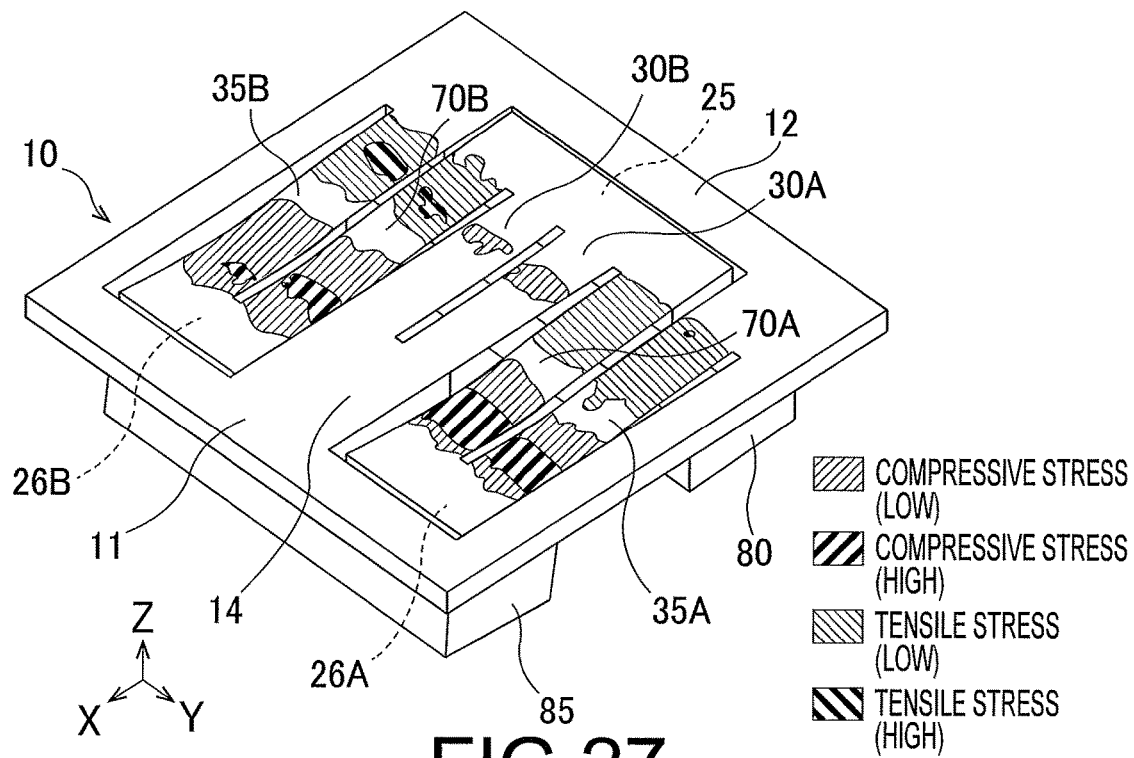
FIG. 27 is a diagram illustrating a distribution of a stress in the X-axis direction in a case where vibration acceleration in the X-axis direction is applied in the power generating element illustrated in FIG. 22.
Figure 28:
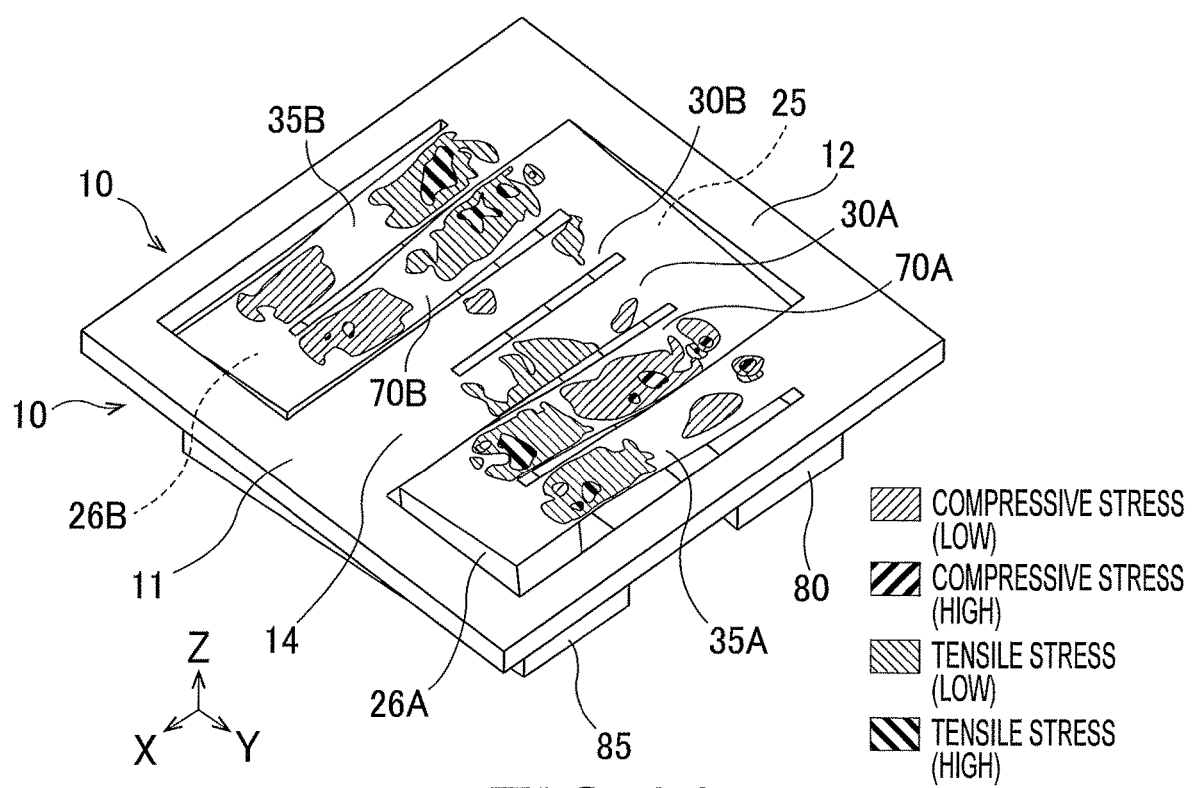
FIG. 28 is a diagram illustrating a distribution of a stress in the X-axis direction in a case where vibration acceleration in the Y-axis direction is applied in the power generating element illustrated in FIG. 22.
Figure 29:
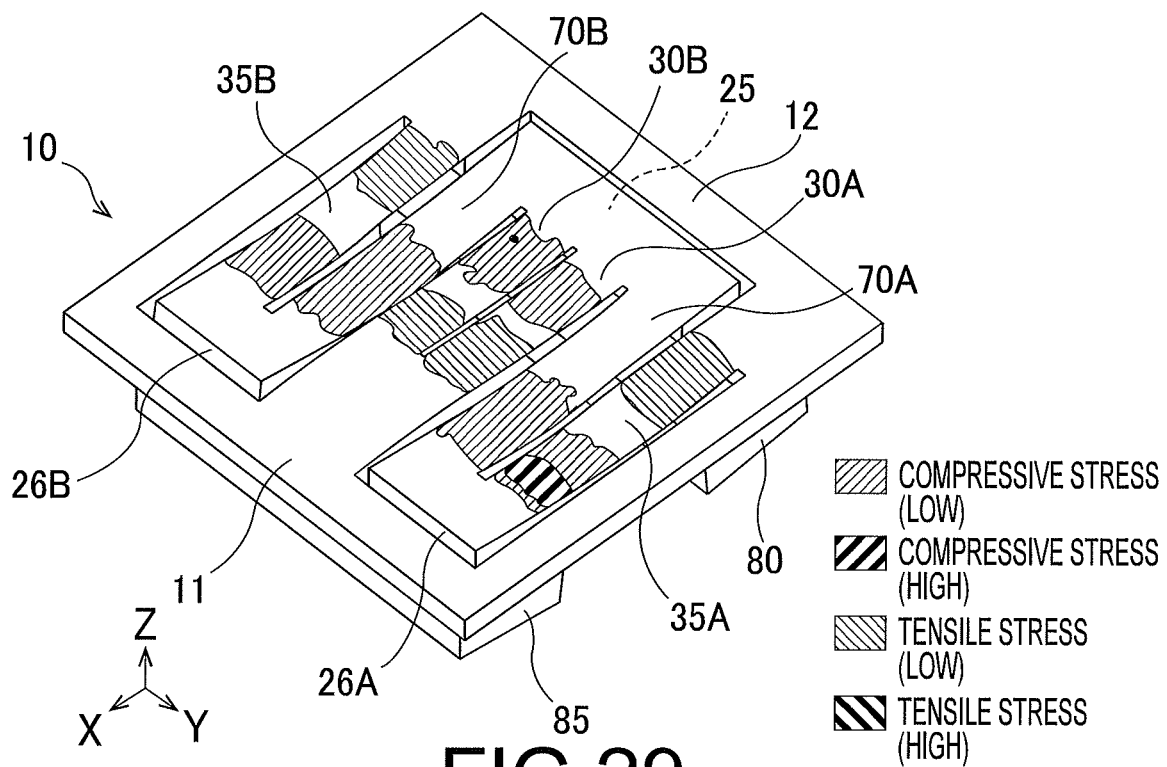
FIG. 29 is a diagram illustrating a distribution of a stress in the X-axis direction in a case where vibration acceleration in the Z-axis direction is applied in the power generating element illustrated in FIG. 22.

On the power generating element 1 according to the fourth embodiment described with reference to FIGS. 23 to 26, the stress of each of the bridge portions 30A, 30B, 35A, 35B, 70A, and 70B in the X-axis direction generated by application of vibration acceleration was obtained by three-dimensional analysis. Results are illustrated in FIGS. 27 to 29. FIG. 27 illustrates the distribution of stress in the X-axis direction when vibration acceleration of a certain frequency in the X-axis direction is applied. FIG. 28 illustrates the distribution of stress in the X-axis direction when vibration acceleration of a certain frequency in the Y-axis direction is applied. FIG. 29 illustrates a distribution of stress in the X-axis direction when a vibration acceleration of a certain frequency in the Z-axis direction is applied. Note that while FIGS. 27 to 29 illustrate the shape of the power generating element 1, the figures do not include the additional support frame 90. Absence of the additional support frame 90 would not affect the analysis result in performing the three-dimensional analysis, since a fixed condition is set on the support frame 10.

As illustrated in FIGS. 27 to 29, stress is generated in each of the bridge portions 30A, 30B, 35A, 35B, 70A, and 70B for any vibration acceleration in any direction. From this, it is possible to confirm that the power generating element 1 is capable of performing three-axis power generation.

Moreover, it can be observed that the arrangement of the upper electrode layers E11A to E34A and E11B to E34B of the piezoelectric element 40 illustrated in FIG. 14 corresponds to the position of generation of the stress illustrated in FIGS. 27 to 29. From this, it is reasonable to determine that it is possible to efficiently generate charge from the stress generated in each of the bridge portions 30A, 30B, 35A, 35B, 70A, and 70B, leading to enhancement of the power generation efficiency, in particular, the power generation efficiency of three-axis power generation.

Figure 30:
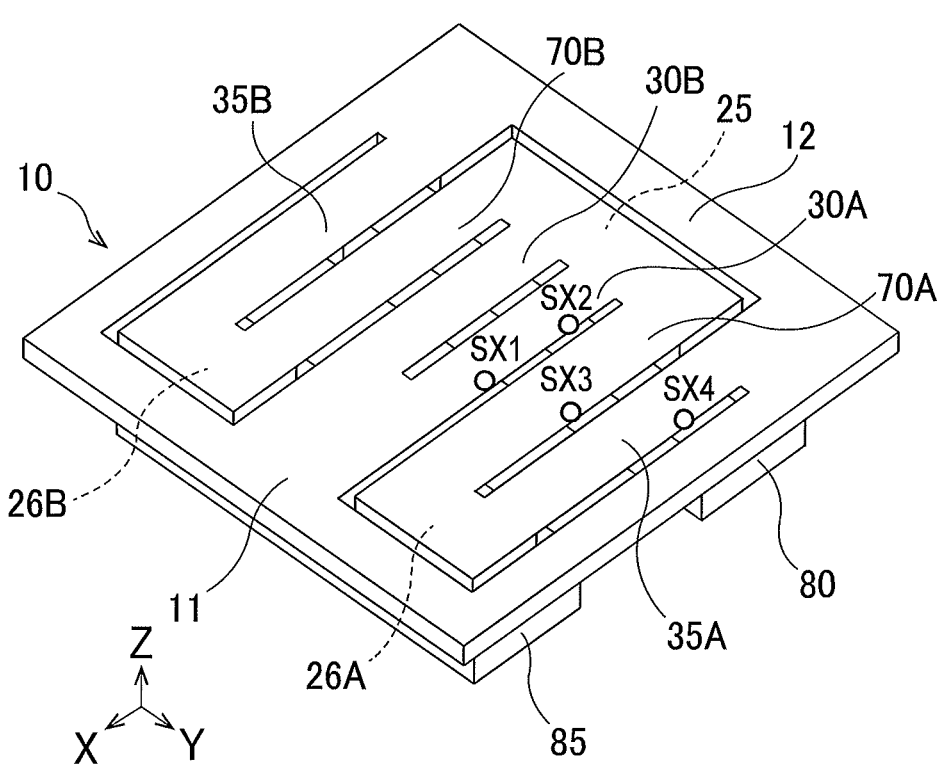
FIG. 30 is a perspective view illustrating measurement points of stress in the power generating element illustrated in FIG. 22.
Figure 31:
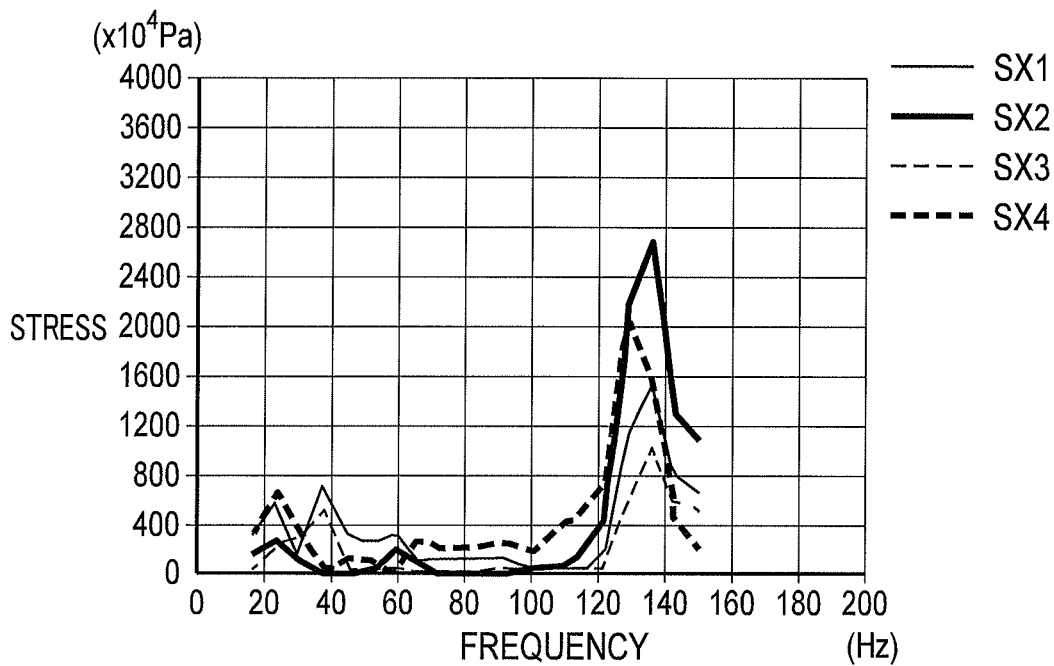
FIG. 31 is a graph illustrating a relationship between the frequency of the vibration acceleration applied in the X-axis direction and the stress generated at the measurement point illustrated in FIG. 30.
Figure 32:
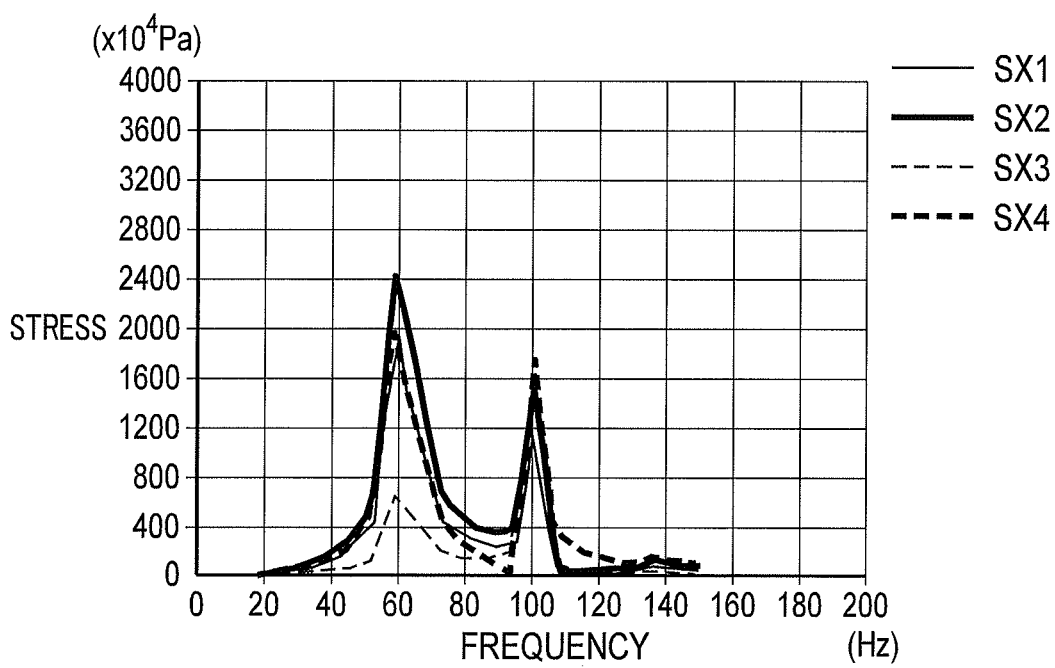
FIG. 32 is a graph illustrating a relationship between the frequency of the vibration acceleration applied in the Y-axis direction and the stress generated at the measurement point illustrated in FIG. 30.
Figure 33:
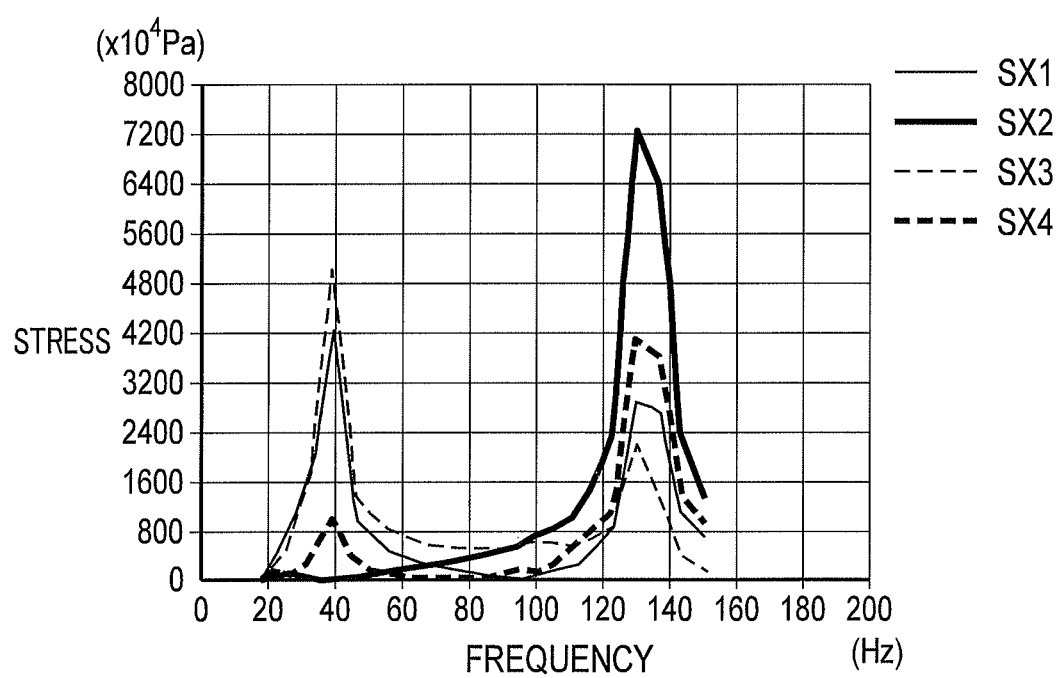
FIG. 33 is a graph illustrating a relationship between the frequency of the vibration acceleration applied in the Z-axis direction and the stress generated at the measurement point illustrated in FIG. 30.

In addition, the frequency characteristics of the power generating element 1 in the fourth embodiment were examined. Specifically, the stress (amplitude) generated at several measurement points was obtained with various frequency patterns of the vibration acceleration applied to the power generating element 1. FIG. 30 is a perspective view illustrating the measurement points (SX1, SX2, SX3, and SX4). FIG. 31 is a chart illustrating a relationship between the frequency of the vibration acceleration applied in the X-axis direction and the stress generated at the measurement point illustrated in FIG. 30. FIG. 32 is a chart illustrating a relationship between the frequency of the vibration acceleration applied in the Y-axis direction and the stress generated at the measurement point illustrated in FIG. 30. FIG. 33 is a chart illustrating a relationship between the frequency of the vibration acceleration applied in the Z-axis direction and the stress generated at the measurement point illustrated in FIG. 30. In FIGS. 31 to 33, the horizontal axis represents the frequency of the vibration acceleration and the vertical axis represents the stress (unit: Pa) generated at each of the measurement points.

As illustrated in FIGS. 31 to 33, two spectral peak waveforms were obtained for vibration acceleration in any direction. This is because, as described above, the vibrating body 20 includes the first weight body 25, the second weight bodies 26A and 26B, the first additional weight body 80, and the second additional weight body 85 so as to enable the power generating element 1 to be configured with the combined vibration system including: the resonance system IV mainly based on the first weight body 25, the first additional weight body 80, and the first bridge portions 30A and 30B; and the resonance system V mainly based on the second weight bodies 26A and 26B, the second additional weight body 85, and the second bridge portions 35A and 35B. From this, it is possible to confirm that the power generating element 1 is capable of expand the frequency band in which power generation is available.

The analysis results illustrated in FIGS. 27 to 29 and FIGS. 31 to 33 are based on the configuration of the power generating element 1 according to the fourth embodiment. However, the main differences between the power generating element 1 according to the third embodiment and the power generating element 1 according to the fourth embodiment are the shape of the first stopper portions 82A and 82B and the presence or absence of the third stopper portions 88A and 88B. Therefore, the power generating element 1 according to the third embodiment is also capable of achieving the similar results illustrated in FIGS. 27 to 29 and FIGS. 31 to 33. Moreover, the main differences between the power generating element 1 according to the second embodiment and the power generating element 1 according to the fourth embodiment are the presence or absence of the first additional weight body 80 and the presence or absence of the second additional weight body 85. Since configuration are similar with each other in the other points, the similar result as illustrated in FIGS. 27 to 29 and FIGS. 31 to 33 can be obtained also in the power generating element 1 according to the second embodiment.

The invention claimed is:

1. A power generating element comprising:
a support frame formed in a frame shape in plan view;
a vibrating body provided inside the support frame;
a first bridge portion and a second bridge portion configured to support the vibrating body on the support frame; and
a charge generating element that generates a charge at the time of displacement of the vibrating body,
wherein the support frame includes a first frame portion arranged on a first side with respect to the vibrating body and includes a second frame portion arranged on a second side opposite to the first side with respect to the vibrating body,
the first bridge portion couples the vibrating body with the first frame portion, and
the second bridge portion couples the vibrating body with the second frame portion,
wherein the vibrating body includes:
a first weight body coupled to the first bridge portion; a second weight body coupled to the second bridge portion; and a third bridge portion coupling the first weight body with the second weight body, and
the first weight body and the second weight body are spaced apart from each other,
wherein the second weight body and the second bridge portion are individually arranged on both sides of the first bridge portion,
the third bridge portion is arranged individually between the first bridge portion and the second bridge portion,
the first weight body is coupled to each of the first bridge portion and the third bridge portion,
the second weight body is coupled to the corresponding second bridge portion and the corresponding third bridge portion, and one second weight body and the other second weight body are spaced apart from each other.

2. The power generating element according to claim 1, wherein a resonance system defined on the basis of the first weight body and the first bridge portion has a resonance frequency different from a resonance frequency of a resonance system defined on the basis of the second weight body and the second bridge portion.

3. The power generating element according to claim 1, wherein the second bridge portion extends along the first bridge portion, and
the third bridge portion extends along the first bridge portion and the second bridge portion.

4. The power generating element according to claim 1, wherein a resonance system defined on the basis of the one second weight body and the corresponding second bridge portion has a resonance frequency same as a resonance frequency of a resonance system defined on the basis of the other second weight body and the corresponding second bridge portion.

5. The power generating element according to claim 1, wherein a first weight body supporting portion that supports the first weight body extends from the first bridge portion, and
a first additional weight body is provided on the first weight body, on a side opposite to the first weight body supporting portion side.

6. The power generating element according to claim 5, wherein the first additional weight body includes a first stopper portion provided so as to be able to abut the support frame and to regulate a displacement of the first weight body toward the first weight body supporting portion side, and
the first stopper portion is spaced apart from the support frame when the vibrating body is in a neutral position.

7. The power generating element according to claim 6, wherein the first stopper portion is arranged at each of both ends of the first additional weight body in a direction orthogonal to a direction from the first weight body toward the first frame portion.

8. The power generating element according to claim 7, wherein the first stopper portion of the first additional weight body extends to an outer edge of the support frame in plan view.

9. The power generating element according to claim 1, wherein a second weight body supporting portion that supports the second weight body extends from the second bridge portion, and
a second additional weight body is provided on the second weight body, on a side opposite to the second weight body supporting portion side.

10. The power generating element according to claim 9, wherein the second additional weight body extends from one second weight body to the other second weight body and is supported by both of the second weight bodies.

11. The power generating element according to claim 10, wherein the second additional weight body includes a second stopper portion provided so as to be able to abut the support frame and to regulate a displacement of the second weight body toward the second weight body supporting portion side, and
the second stopper portion is spaced apart from the support frame when the vibrating body is in a neutral position.

12. The power generating element according to claim 11, wherein the support frame includes a protrusion interposed between the first frame portion and the first bridge portion, and
the protrusion includes a seat to which the second stopper portion can abut.

13. The power generating element according to claim 11, wherein the second additional weight body further includes a third stopper portion provided so as to be able to abut the support frame and to regulate a displacement of the second weight body toward the second weight body supporting portion side, and
the third stopper portion is spaced apart from the support frame when the vibrating body is in the neutral position.

14. The power generating element according to claim 13, wherein the third stopper portion is arranged at each of both ends of the second additional weight body in a direction orthogonal to a direction from the second weight body toward the second frame portion.

15. The power generating element according to claim 14, wherein the third stopper portion of the second additional weight body extends to an outer edge of the support frame in plan view.

16. The power generating element according to claim 1, wherein a second weight body supporting portion that supports the second weight body extends from the second bridge portion, and
a second additional weight body is provided on the second weight body, on a side opposite to the second weight body supporting portion side.

17. The power generating element according to claim 1, wherein the charge generating element includes:
a lower electrode layer;
a piezoelectric material layer provided on the lower electrode layer; and
a plurality of upper electrode layers provided on the piezoelectric material layer, each of the upper electrode layers being electrically independent from each other.

18. The power generating element according to claim 1, further comprising a power generating circuit that rectifies a current based on a charge generated by the charge generating element and extracts electric power.

19. A power generating element comprising:
a support frame formed in a frame shape in plan view;
a vibrating body provided inside the support frame;
a first bridge portion and a second bridge portion configured to support the vibrating body on the support frame; and
a charge generating element that generates a charge at the time of displacement of the vibrating body,
wherein the support frame includes a first frame portion arranged on a first side with respect to the vibrating body and includes a second frame portion arranged on a second side opposite to the first side with respect to the vibrating body,
the first bridge portion couples the vibrating body with the first frame portion, and
the second bridge portion couples the vibrating body with the second frame portion,
wherein the vibrating body includes:
a first weight body coupled to the first bridge portion; a second weight body coupled to the second bridge portion; and a third bridge portion coupling the first weight body with the second weight body, and
the first weight body and the second weight body are spaced apart from each other, wherein a first weight body supporting portion that supports the first weight body extends from the first bridge portion, and a first additional weight body is provided on the first weight body, on a side opposite to the first weight body supporting portion side.

20. A power generating element comprising:

a support frame formed in a frame shape in plan view;

a vibrating body provided inside the support frame;

a first bridge portion and a second bridge portion configured to support the vibrating body on the support frame; and a charge generating element that generates a charge at the time of displacement of the vibrating body, wherein the support frame includes a first frame portion arranged on a first side with respect to the vibrating body and includes a second frame portion arranged on a second side opposite to the first side with respect to the vibrating body, the first bridge portion couples the vibrating body with the first frame portion, and the second bridge portion couples the vibrating body with the second frame portion, wherein the vibrating body includes:

a first weight body coupled to the first bridge portion; a second weight body coupled to the second bridge portion; and a third bridge portion coupling the first weight body with the second weight body, and the first weight body and the second weight body are spaced apart from each other, wherein a second weight body supporting portion that supports the second weight body extends from the second bridge portion, and a second additional weight body is provided on the second weight body, on a side opposite to the second weight body supporting portion side.

* * * * *